United States Patent
Ogasawara et al.

(10) Patent No.: US 10,629,406 B2
(45) Date of Patent: Apr. 21, 2020

(54) OPTICAL SYSTEM ADJUSTMENT METHOD OF IMAGE ACQUISITION APPARATUS

(71) Applicant: NuFlare Technology, Inc., Yokohama-shi (JP)

(72) Inventors: Munehiro Ogasawara, Hiratsuka (JP); Nobutaka Kikuiri, Koganei (JP); Atsushi Ando, Edogawa-ku (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 16/053,367

(22) Filed: Aug. 2, 2018

(65) Prior Publication Data

US 2019/0051487 A1    Feb. 14, 2019

(30) Foreign Application Priority Data

Aug. 10, 2017 (JP) ................. 2017-155374

(51) Int. Cl.
| | |
|---|---|
| *H01J 37/244* | (2006.01) |
| *H01J 37/04* | (2006.01) |
| *H01J 37/22* | (2006.01) |
| *H01J 37/147* | (2006.01) |
| *H01J 37/317* | (2006.01) |

(52) U.S. Cl.
CPC ......... *H01J 37/244* (2013.01); *H01J 37/045* (2013.01); *H01J 37/1471* (2013.01); *H01J 37/222* (2013.01); *H01J 37/3177* (2013.01); *H01J 2237/024* (2013.01); *H01J 2237/0435* (2013.01); *H01J 2237/1501* (2013.01); *H01J 2237/20228* (2013.01);

(Continued)

(58) Field of Classification Search
None
See application file for complete search history.

(56) References Cited

U.S. PATENT DOCUMENTS

| | | | |
|---|---|---|---|
| 8,552,373 B2 | 10/2013 | Enyama et al. | |
| 9,666,405 B1 * | 5/2017 | Lanio ............. | H01J 37/244 |

(Continued)

FOREIGN PATENT DOCUMENTS

| | | |
|---|---|---|
| JP | 11-37957 | 2/1999 |
| JP | 2017-151155 | 8/2017 |

(Continued)

*Primary Examiner* — Michael J Logie
(74) *Attorney, Agent, or Firm* — Oblon, McClelland, Maier & Neustadt, L.L.P.

(57) ABSTRACT

According to one aspect of the present invention, an optical system adjustment method of an image acquisition apparatus includes: extracting one primary electron beam after another from primary electron beams at a plurality of preset positions among multiple primary electron beams; and adjusting, a first detector being capable of individually detecting multiple secondary electrons emitted due to irradiation of a target with the multiple primary electron beams, a trajectory of the one primary electron beam using a primary electron optics while detecting secondary electrons corresponding to the one primary electron beam for each of the primary electron beams extracted one by one using a movable second detector having an inspection surface of a size capable of detecting the multiple secondary electrons as a whole and arranged on an optical path for guiding the multiple secondary electrons to the first detector.

8 Claims, 21 Drawing Sheets

(52) U.S. Cl.
CPC .............. *H01J 2237/2448* (2013.01); *H01J 2237/2811* (2013.01); *H01J 2237/2817* (2013.01)

(56) References Cited

U.S. PATENT DOCUMENTS

| | | | |
|---|---|---|---|
| 9,859,096 B2 | 1/2018 | Ogasawara | |
| 2006/0151711 A1* | 7/2006 | Frosien | H01J 37/05 250/396 ML |
| 2009/0001267 A1* | 1/2009 | Enyama | G01N 23/22 250/310 |
| 2010/0065753 A1* | 3/2010 | Enyama | H01J 37/1472 250/397 |
| 2011/0272576 A1* | 11/2011 | Otaki | B82Y 10/00 250/306 |
| 2012/0061565 A1* | 3/2012 | Enyama | H01J 37/265 250/307 |
| 2016/0268096 A1* | 9/2016 | Ren | H01J 37/28 |
| 2017/0243715 A1 | 8/2017 | Ogasawara | |

FOREIGN PATENT DOCUMENTS

| | | |
|---|---|---|
| JP | 2017-151159 | 8/2017 |
| WO | WO 2010/137257 A1 | 12/2010 |

\* cited by examiner

OPTICAL SYSTEM ADJUSTMENT METHOD OF IMAGE ACQUISITION APPARATUS

CROSS-REFERENCE TO RELATED APPLICATION

This application is based upon and claims the benefit of priority from prior Japanese Patent Application No. 2017-155374 filed on Aug. 10, 2017 in Japan, the entire contents of which are incorporated herein by reference.

BACKGROUND OF THE INVENTION

Field of the Invention

Embodiments described herein relate generally to an optical system adjustment method of an image acquisition apparatus. For example, embodiments described herein relate generally to an image acquisition apparatus for acquiring a secondary electron image of a pattern emitted due to irradiation with multiple beams using electron beams.

Related Art

In recent years, with increasingly higher integration and larger capacities of large scale integrated circuits (LSI), circuit linewidths required for semiconductor devices become increasingly narrower. These semiconductor devices are manufactured by using an original image pattern (also referred to as a mask or a reticle. Hereinafter, referred to generically as a "mask") on which a circuit pattern is formed, and exposing and transferring the pattern onto a wafer using a reduction projection exposure apparatus called a stepper to form a circuit.

Improvements in yield are indispensable for the manufacture of LSI that needs a large amount of manufacturing costs. However, as representatively shown by 1 GB DRAM (random access memory), patterns constituting LSI have transitioned from sub micrometer to that of nanometer. In recent years, with increasingly finer dimensions of LSI patterns formed on semiconductor wafers, dimensions that need to be detected as pattern defects are now extremely small. Therefore, in an image pickup apparatus represented by a pattern inspection apparatus for inspecting defects of an ultrafine pattern transferred onto a semiconductor wafer, the acquisition of a highly accurate pattern image is required.

For example, in an inspection apparatus as an example of an apparatus that captures a pattern image, a pattern formed on a substrate such as a semiconductor wafer or a lithography mask by using an enlarging optical system is captured at a predetermined magnification using a laser light to obtain an optical image. Then, a method of conducting inspection by comparing such an optical image with design data or an optical image obtained by capturing the same pattern on a target object is known. For example, "die to die inspection" that compares optical image data capturing the same pattern in different places on the same mask and "die to database inspection" that, when writing pattern-designed CAD data to a mask as a pattern, inputs pattern writing data (design pattern data) converted into an apparatus input format for a lithography apparatus to input into an inspection apparatus, generates design image data (reference image) based thereon, and compares this data with an optical image as measurement data capturing the pattern are available as the pattern inspection method. In an inspection method in such an inspection apparatus, an inspection target substrate is placed on a stage and the stage is moved for a luminous flux to scan the target object to conduct inspection. The inspection target substrate is irradiated with a luminous flux by a light source and an illuminating optical system. Light transmitted or reflected by the inspection target substrate is formed as an image on a sensor via an optical system. An image captured by the sensor is sent to a comparison circuit as measurement data. After images are aligned, the comparison circuit compares the measurement data and reference data using an appropriate algorithm and if not matched, determines that there are pattern defects.

In the above pattern inspection apparatus, an inspection target substrate is irradiated with laser light and a transmitted image or a reflected image thereof is captured to acquire an optical image. On the other hand, development of an inspection apparatus that irradiates a target substrate with an electron beam, detects secondary electrons corresponding to each beam emitted from the target substrate, and acquires a pattern image has been advanced. With regard to an apparatus that captures a pattern using an electron beam represented by an inspection apparatus, development of a method using multiple beams is advanced, including a method using a single beam (see, for example, WO 2010/1037257 A).

In an apparatus for capturing a pattern using multiple beams, an adjustment of a primary optical system that irradiates a target object surface with multiple beams to be a primary beam and an adjustment of a secondary optical system that guides multiple secondary electrons emitted from the target object surface to respective desired positions detected individually by a multi-detector are needed. However, when multiple beams are used, if the adjustment of the secondary optical system is not completed, a secondary electron image cannot be obtained by the multi-detector, so the adjustment of the primary optical system using the secondary electron image cannot be made. Conversely, if the adjustment of the primary optical system is not completed, the secondary electrons deviate from an optical path of the secondary optical system, and the adjustment of the secondary optical system cannot be made. Thus, a contradiction arises such that if the adjustment of the secondary optical system is not completed, the primary optical system cannot be adjusted. Conversely, if the adjustment of the primary optical system is not completed, the secondary optical system cannot be adjusted.

BRIEF SUMMARY OF THE INVENTION

According to one aspect of the present invention, an optical system adjustment method of an image acquisition apparatus includes:

extracting one primary electron beam after another from primary electron beams at a plurality of preset positions among multiple primary electron beams;

adjusting, a first detector being capable of individually detecting multiple secondary electrons emitted due to irradiation of a target with the multiple primary electron beams, a trajectory of the one primary electron beam using a primary electron optics while detecting secondary electrons corresponding to the one primary electron beam for each of the primary electron beams extracted one by one using a movable second detector having an inspection surface of a size capable of detecting the multiple secondary electrons as a whole and arranged on an optical path for guiding the multiple secondary electrons to the first detector; and after adjustments of the trajectory of each of the primary electron beams extracted one by one being completed, adjusting the trajectory of the secondary electrons using a secondary electron optics such that the secondary electrons corresponding to the one primary electron beam are detected in a corresponding region of the first detector for each of the primary electron beams extracted one by one in a state that the second detector has been moved from the optical path to an outside of the optical path.

According to another aspect of the present invention, an optical system adjustment method of an image acquisition apparatus includes:

extracting one primary electron beam after another from primary electron beams at a plurality of preset positions among multiple primary electron beams;

adjusting, a first detector being capable of individually detecting multiple secondary electrons emitted due to irradiation of a target with the multiple primary electron beams, a trajectory of the primary electron beam using a primary electron optics while detecting secondary electrons corresponding to the one primary electron beam for each of the primary electron beams extracted one by one using a second detector having an inspection surface of a size capable of detecting multiple secondary electrons as a whole by performing trajectory deflection of the secondary electrons by a deflector arranged on an optical path for guiding the multiple secondary electrons to the first detector; and after adjustments of the trajectory of each of the primary electron beams extracted one by one being completed, adjusting the trajectory of the secondary electrons using a secondary electron optics such that the secondary electrons corresponding to the primary electron beam are detected in a corresponding region of the first detector for each of the primary electron beams extracted one by one while the trajectory deflection of the secondary electrons by the deflector to the second detector is stopped.

DETAILED DESCRIPTION OF THE INVENTION

In the embodiments described below, a method capable of adjusting a primary optical system and a secondary optical system in an image acquisition apparatus using multiple beams will be described.

Also, in the embodiments described below, an inspection apparatus that captures a secondary electronic image by irradiating a substrate to be inspected with multiple beams using an electron beam will be described as an example of an apparatus that acquires an image of a substrate. However, the present embodiment is not limited to such an example. In addition to the electron beam, a beam using charged particles such as an ion beam may also be used. The apparatus may not be an inspection apparatus, as long as the apparatus acquires an image by using multiple beams.

Embodiment 1

Figure 1:
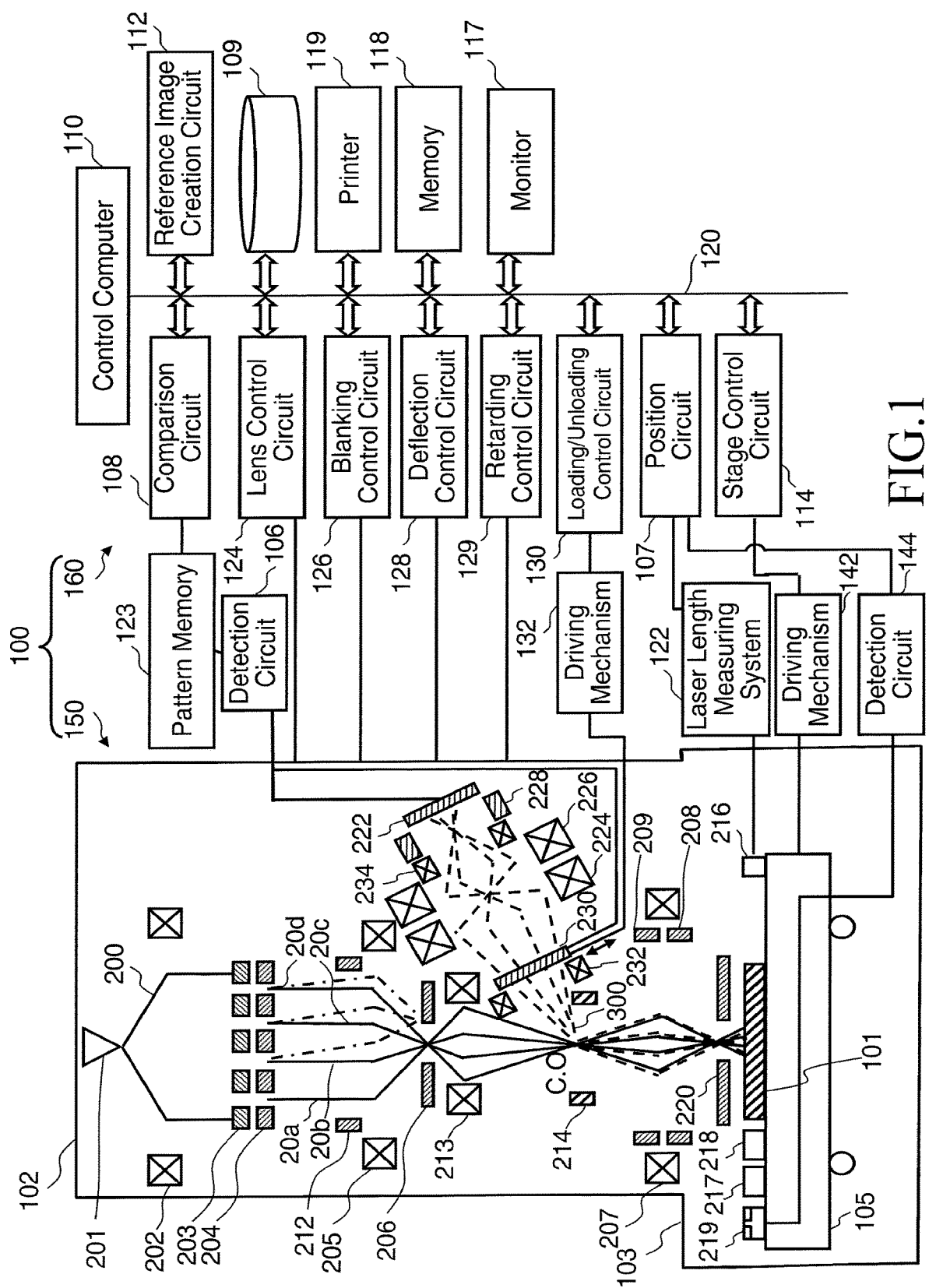
FIG. 1 is a block diagram showing the configuration of a pattern inspection apparatus according to Embodiment 1.

FIG. 1 is a block diagram showing the configuration of a pattern inspection apparatus according to Embodiment 1. In FIG. 1, an inspection apparatus 100 that inspects a pattern formed on a substrate is an example of an image acquisition apparatus. The inspection apparatus 100 includes an image acquisition mechanism 150 and a control system circuit 160 (control unit). The image acquisition mechanism 150 includes an electron beam column 102 (electron optical column), an inspection chamber 103, a detection circuit 106, a pattern memory 123, a driving mechanism 132, a stage driving mechanism 142, and a laser length measuring system 122. Inside the electron beam column 102, an electron gun assembly 201, an illumination lens 202, a shaping aperture plate array substrate 203, a blanking aperture array mechanism 204, a reduction lens 205, a limiting aperture plate substrate 206, an objective lens 207, a main deflector 208, a sub deflector 209, a collective blanking deflector 212, a reduction lens 213, a beam separator 214, a retarding electrode 220, a multi-detector 222, projection lenses 224, 226, a deflector 228, a wide-area detector 230, and alignment coils 232, 234 are arranged.

Inside the inspection chamber 103, an XY stage 105 capable of moving at least on an XY plane is arranged. A substrate 101 to be inspected is arranged on the XY stage 105. The substrate 101 includes a mask substrate for exposure and a semiconductor substrate such as a silicon wafer.

When the substrate 101 is a semiconductor substrate, a plurality of chip patterns (wafer dies) are formed on the semiconductor substrate. When the substrate 101 is a mask substrate for exposure, a chip pattern is formed on the mask substrate for exposure. A plurality of chip patterns (wafer dies) is formed on the semiconductor substrate by the chip pattern formed on the mask substrate for exposure being exposed and transferred onto the semiconductor substrate a plurality of times. Hereinafter, the case where the substrate 101 is a semiconductor substrate will mainly be described. The substrate 101 is arranged on the XY stage 105 with, for example, a pattern forming surface directed upward. An electrostatic chuck is normally used to fix the substrate 101 to the XY stage 105. Also, a mirror 216 that reflects laser light for laser measurement emitted from the laser length measuring system 122 arranged outside the inspection chamber 103 is arranged on the XY stage 105. Also, on the XY stage 105, marks 217, 218 having different mark patterns and a transmission mark 219 restricting a beam incident area are arranged. Surface heights of the marks 217, 218 and the transmission mark 219 are suitably matched to the height of the surface of the substrate 101.

The multi-detector 222 and the wide-area detector 230 are connected to the detection circuit 106 outside the electron beam column 102. The detection circuit 106 is connected to the pattern memory 123. Further, the electron beam column 102 and the inspection chamber 103 are evacuated by a vacuum pump (not shown) to form a vacuum state.

As the wide-area detector 230, for example, a semiconductor detector, a plastic scintillator having an antistatic film attached to the surface thereof and to which a photoelectron detector is connected, or a plate made simply of a conductor to which an ammeter is connected can be used. In this case, from the viewpoint of accuracy of measurement of inflow current, it is advantageous to use a material having low efficiency of secondary electron generation such as carbon on the surface.

For example, the primary electron optics is constructed of the illumination lens 202, the shaping aperture plate array substrate 203, the reduction lens 205, the reduction lens 213, the objective lens 207, the main deflector 208, and the sub deflector 209. However, the present embodiment is not limited to the above example and the primary electron optics may include other coils, lenses, deflectors, or the like. Further, for example, the beam separator 214, the projection lenses 224, 226, the deflector 228, and the alignment coils 232, 234 constitute the secondary electron optics. However, the present embodiment is not limited to the above example and the secondary electron optics may include other coils, lenses, deflectors, or the like.

In the control system circuit 160, a control computer 110 that controls the inspection apparatus 100 as a whole is connected to a position circuit 107, a comparison circuit 108, a reference image creation circuit 112, a stage control circuit 114, a lens control circuit 124, a blanking control circuit 126, a deflection control circuit 128, a retarding control circuit 129, a loading/unloading control circuit 130, a detection circuit 134, a storage device 109 such as a magnetic disk drive, a monitor 117, a memory 118, and a printer 119 via a bus 120.

Further, the pattern memory 123 is connected to the comparison circuit 108. The XY stage 105 is driven by the driving mechanism 142 under the control of the stage control circuit 114 In the driving mechanism 142, for example, a drive system such as a three-axis (X-Y-θ) motor driving in the X direction, the Y direction, and the θ direction is configured to make the XY stage 105 movable.

As an X motor, a Y motor, and a θ motor (not shown) of the drive system, for example, a step motor can be used. The XY stage 105 is movable by the motor of each of X, Y, and θ axes in the horizontal direction and the rotation direction. Then, the position of movement of the XY stage 105 is measured by the laser length measuring system 122 and supplied to the position circuit 107. The laser length measuring system 122 measures the position of the XY stage 105 by receiving reflected light from the mirror 216 and applying the principle of laser interferometry. Further, it is desirable to include a Z driving mechanism so as to be able to maintain the height of the upper surface of the substrate 101 constant by adjusting the height in the Z direction of the substrate 101 on the XY stage in accordance with the thickness of the substrate 101. As the Z driving mechanism, a mechanism configured in such a way that two taper-shaped members are combined by a taper portion, one taper-shaped member is supported so as to be limited in movement in the XYθ directions, and the height in the Z direction of the one taper-shaped member is changed by moving the other taper-shaped member in parallel with, for example, the X direction can be used. At this point, the Z driving mechanism is configured to change only the height of the substrate 101 so that the height of the marks 217, 218 does not change. In this manner, a set point of the marks 217, 218 is defined as a reference point and the height of the upper surface of the substrate 101 can be adjusted to match the height of the mark 217 defined as the reference point.

A high-voltage power circuit (not shown) is connected to the electron gun assembly 201 and an electron group emitted from a cathode is accelerated and emitted as an electron beam 200 by applying a voltage to a predetermined extraction electrode (Wehnelt) and heating the cathode at a predetermined temperature, in addition to the application of an acceleration voltage from the high-voltage power circuit to between a filament (not shown) and an extraction electrode (anode) inside the electron gun assembly 201. For example, electromagnetic lenses are used as the illumination lens 202, the reduction lens 205, the reduction lens 213, the objective lens 207, and the projection lenses 224, 226, which are controlled by the lens control circuit 124. The beam separator 214 is also controlled by the lens control circuit 124. The collective blanking deflector 212 and the deflector 228 are each constructed of electrode groups of at least two poles, and are controlled by the blanking control circuit 126. The main deflector 208 and the sub deflector 209 are each constructed of electrode groups of at least four poles, and are controlled by the deflection control circuit 128. The electrode 220 is formed on a disk on which a passing hole penetrating the central portion is formed, and is controlled together with the substrate 101 by the retarding control circuit 129.

Here, in FIG. 1, only the configuration needed to describe Embodiment 1 is shown. Other configurations normally needed for the inspection apparatus 100 may also be included.

Figure 2:
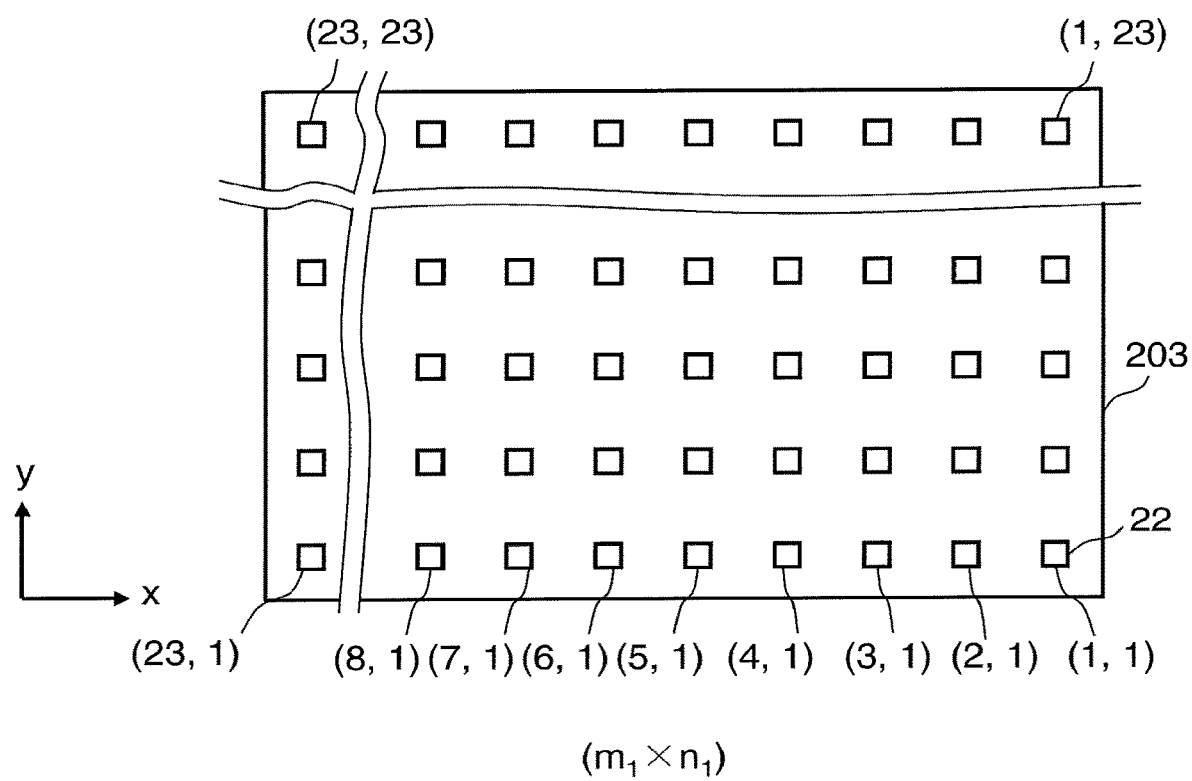
FIG. 2 is a conceptual diagram showing the configuration of a shaping aperture plate array substrate according to Embodiment 1.

FIG. 2 is a conceptual diagram showing the configuration of a shaping aperture plate array substrate according to Embodiment 1. In FIG. 2, holes (openings) 22 in a two-dimensional shape of $m_1$ columns in the width direction (x direction)×$n_1$ tiers in the length direction (y direction) ($m_1$ and $n_1$ are integers of 2 or greater) are formed in the shaping aperture plate array substrate 203 with predetermined arrangement pitches in the x and y directions. In the example of FIG. 2, a case where 23×23 holes (openings) 22 are formed is shown. Each of the holes 22 is formed in a rectangular shape of the same dimensions. Alternatively, each of the holes 22 may be formed in a circular shape of the same outside diameter. Multiple beams 20 are formed by a portion of the electron beam 200 being passed through each of a plurality of these holes 22. Here, an example in which the holes 22 of two rows or more are arranged both in the width and length directions (x, y directions) is shown, but the present embodiment is not limited to such an example. For example, a plurality of rows may be arranged in one of the width and length directions (x or y direction) and only one row may be arranged in the other direction. Also, the method of arranging the holes 22 is not limited to a case of arranging holes in a grid-like shape like in FIG. 2. For example, the holes in the k-th row and the (k+1)-th row in the length direction (y direction) may be arranged by being shifted by a dimension a in the width direction (x direction) from each other. Similarly, the holes in the (k+1)-th row and the (k+2)-th row in the length direction (y direction) may be arranged by being shifted by a dimension b in the width direction (x direction) from each other. Next, the operation of the image acquisition mechanism 150 in the inspection apparatus 100 will be described.

The electron beam 200 emitted from the electron gun assembly 201 (emission source) illuminates the entire shaping aperture plate array substrate 203 almost vertically through the illumination lens 202. The shaping aperture plate array substrate 203 has a plurality of rectangular holes 22 (openings) formed therein and the electron beam 200 illuminates a region including all the plurality of holes 22. A plurality of electron beams (multiple beams) 20a to 20d (solid lines in FIG. 1) in, for example, a rectangular shape is formed by each portion of the electron beam 200 with which the positions of the plurality of holes 22 are irradiated being passed through each of the plurality of holes 22 of the shaping aperture plate array substrate 203.

The formed multiple beams 20a to 20d (primary electron beams) pass through the blanking aperture array mechanism 204 and are reduced by the reduction lens 205 before traveling toward a hole in the center formed in the limiting aperture plate substrate 206. Here, when the multiple beams 20a to 20d as a whole are collectively deflected by the collective blanking deflector 212 disposed between the shaping aperture plate array substrate 203 (blanking aperture array mechanism 204) and the reduction lens 205, the position of the multiple beams is displaced from the hole in the center of the limiting aperture plate substrate 206 and the multiple beams are shielded by the limiting aperture plate substrate 206. On the other hand, the multiple beams 20a to 20d not deflected by the collective blanking deflector 212 pass, as shown in FIG. 1, through the hole in the center of the limiting aperture plate substrate 206. The blanking control is exercised by ON/OFF of the collective blanking deflector 212 and thereby, ON/OFF of a beam is collectively controlled. In this manner, the limiting aperture plate substrate 206 shields the multiple beams 20a to 20d deflected so as to be in a beam OFF state by the collective blanking deflector 212. Then, the multiple beams 20a to 20d for inspection are formed by a beam group formed between beam ON and beam OFF and having passed through the limiting aperture plate substrate 206.

The multiple beams 20a to 20d having passed through the limiting aperture plate substrate 206 are refracted by the reduction lens 213 toward the optical axis to form a crossover (C.O.). Then, after passing through the beam separator 214 disposed at a crossover position of the multiple beams 20, the multiple beams 20a to 20d travel to the objective lens 207. The multiple beams 20a to 20d having passed through the beam separator 214 are focused on the surface of the substrate 101 by the objective lens 207 to form an image of the multiple beams 20a to 20d (electron beam) on the substrate 101. At this point, the multiple beams 20a to 20d become a pattern image (beam diameter) of a desired reduction ratio, and the whole of the multiple beams 20 having passed through the limiting aperture plate substrate 206 is collectively deflected in the same direction by the main deflector 208 and the sub deflector 209 and passes through a passing hole in the central portion of the electrode 220 before the irradiation position of each beam on the substrate 101 is irradiated with the multiple beams. In such a case, the main deflector 208 collectively deflects the whole of the multiple beams 20 to the reference position of the mask die scanned by the multiple beams 20. When scanning is performed while continuously moving the XY stage 105, tracking deflection is further performed so as to follow the movement of the XY stage 105. Then, the sub deflector 209 collectively deflects the whole of the multiple beams 20 so that each beam scans the corresponding region. The multiple beams 20 emitted at a time are ideally arranged with pitches obtained by multiplying the arrangement pitch of the plurality of holes 22 of the shaping aperture plate array substrate 203 by the above desired reduction ratio (1/a). In this manner, the electron beam column 102 irradiates the substrate 101 with $m_1 \times n_1$ multiple beams 20 in a two-dimensional shape at a time. A flux of secondary electrons (multiple secondary electrons 300) corresponding to each beam of the multiple beams 20 and including reflected electrons (dotted lines in FIG. 1) is emitted from the substrate 101 due to irradiation to a desired position on the substrate 101 with the multiple beams 20.

Here, a voltage is applied to between the electrode 220 and the substrate 101 by the retarding control circuit 129 so that desired incident energy of the primary electron beam onto the substrate can be obtained. Similarly to the electron beam column 102, the electrode 220 is set to the ground potential and the substrate 101 is set to a predetermined negative potential. Accordingly, the primary electron beam (multiple beams 20) accelerated by high energy under vacuum is decelerated immediately before hitting the substrate 101 and also low-energy secondary electrons emitted from the substrate 101 (multiple secondary electrons 300) can be accelerated toward the multi-detector 222 side.

The multiple secondary electrons 300 emitted from the substrate 101 pass through the passing hole of the electrode 220 and then are refracted to the center side of the multiple secondary electrons 300 by the objective lens 207 before traveling to the beam separator 214.

Here, the beam separator 214 (for example, a Wien filter) generates an electric field and a magnetic field in directions orthogonal to each other on a plane orthogonal to the traveling direction (optical axis) of the multiple beams 20. The electric field exerts a force in the same direction regardless of the traveling direction of electrons. In contrast, the magnetic field exerts a force according to the Fleming's left-hand rule. Therefore, the direction of the force acting on electrons can be changed depending on the direction of penetration of electrons. The force due to the electric field and the force due to the magnetic field cancel each other on the multiple beams (primary electron beams) entering the beam separator 214 from above and the multiple beams 20 travel straight downward. On the other hand, the force due to the electric field and the force due to the magnetic field both act in the same direction on the multiple secondary electrons 300 entering the beam separator 214 from below, and the multiple secondary electrons 300 are bent obliquely upward.

The multiple secondary electrons 300 bent obliquely upward are projected onto the multi-detector 222 while being refracted by the projection lenses 224, 226 in a state where the wide-area detector 230 is not loaded onto the optical path. The multi-detector 222 detects the projected multiple secondary electrons 300. The multi-detector 222 has, for example, a diode type two-dimensional sensor (not shown). Then, in the diode-type two-dimensional sensor position corresponding to each beam of the multiple beams 20, each secondary electron of the multiple secondary electrons 300 collides with a diode-type two-dimensional sensor to generate electrons, and secondary electrons image data for each pixel described later. When the XY stage 105 performs a scanning operation while moving, the deflector 228 deflects the multiple secondary electrons 300 (tracking control) so as to follow the movement of the XY stage 105 so that the detection position of each secondary electron of the multiple secondary electrons 300 in the multi-detector 222 do not deviate with the movement of the XY stage 105.

As described above, the inspection apparatus 100 has a primary electron optics that adjusts the trajectory (the irradiation position, focal point and so on) of the multiple beams 20 (primary electron beams) and a secondary electron optics that adjusts the trajectory (the irradiation position, focal point and so on) of the multiple secondary electrons 300 (secondary electrons) arranged therein. However, in the state where the adjustments (beam adjustments) of the primary electron optics and the secondary electron optics are not completed, the above-described trajectory of electrons is not normally obtained. Therefore, adjustments of the primary electron optics and the secondary electron optics are needed.

Figure 3:
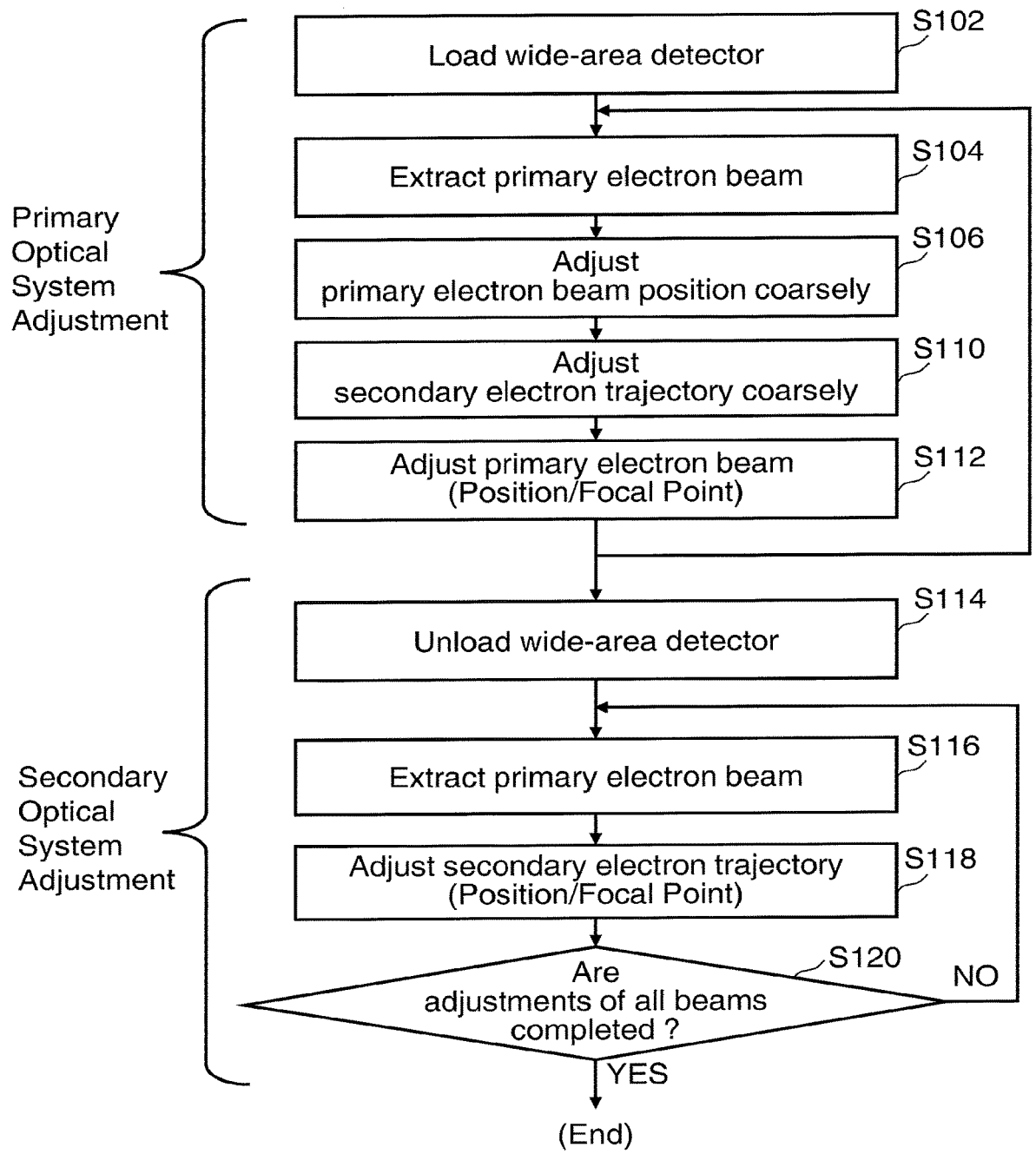
FIG. 3 is a flow chart showing principal processes of an optical system adjustment method of the inspection apparatus according to Embodiment 1.

FIG. 3 is a flow chart showing principal processes of an optical system adjustment method of the inspection apparatus according to Embodiment 1. In FIG. 3, the optical system adjustment method of the inspection apparatus according to Embodiment 1 executes a series of processes including a wide-area detector loading process (S102), a primary electron beam extraction process (S104), a primary electron beam position coarse adjustment process (S106), a secondary electron trajectory coarse adjustment process (S110), a primary electron beam adjustment process (S112), a wide-area detector unloading process (S114), a primary electron beam extraction process (S116), a secondary electron trajectory adjustment process (S118), and a determination process (S120).

Among such a process group, the primary electron optics is adjusted by the wide-area detector loading process (S102), the primary electron beam extraction process (S104), the primary electron beam position coarse adjustment process (S106), the secondary electron trajectory coarse adjustment process (S110), and the primary electron beam adjustment process (S112). The secondary electron optics is adjusted by the wide-area detector unloading process (S114), the primary electron beam extraction process (S116), the secondary electron trajectory adjustment process (S118), and the determination process (S120).

As the wide-area detector loading process (S102), under the control of the loading/unloading control circuit 130, the driving mechanism 132 loads and arranges the wide-area detector 230 on an optical path to guide the multiple secondary electrons 300 emitted due to irradiation to a target with the multiple beams 20 to the multi-detector 222 (first detector) capable of individually detecting the multiple secondary electrons 300. The wide-area detector 230 (second detector) is movable and has a detection surface of a size that can detect the whole of the multiple secondary electrons 300.

More specifically, the wide-area detector 230 is disposed on an optical path between the beam separator 214 and the projection lens 224. Here, even if design parameters are set to the primary electron optics and the secondary electron optics as initial values, the position on the substrate 101 subjected to the irradiation with each beam of the multiple beams 20 may deviate from the desired position. The irradiation position of each of the multiple beams 20 can be checked by a secondary electron image being obtained after secondary electrons reaching the multi-detector 222. Thus, it is necessary to first cause secondary electrons to reach the multi-detector 222. However, if the angle of the traveling direction of secondary electrons bent by the beam separator 214 deviates from a desired angle, secondary electrons may not reach the multi-detector 222. If the position on the substrate 101 subjected to the irradiation with each of the multiple beams 20 changes, the traveling direction of secondary electrons bent by the beam separator 214 also changes. In the inspection apparatus 100 according to Embodiment 1, since the distance from the beam separator 214 to the multi-detector 222 is long, the influence of deviation of the angle of the traveling direction of secondary electrons bent by the beam separator 214 on the positional deviation amount on the detection surface is large. Therefore, in a state in which the adjustment (beam adjustment) of the primary electron optics is not completed, even if the setting of the beam separator 214 should be correct, the positional deviation amount of the multi-detector 222 far away from the beam separator 214 may be too large so that it is difficult to detect secondary electrons in the first place. As a result, a secondary electron image cannot be obtained and the adjustment itself of the primary electron optics becomes difficult. Therefore, in Embodiment 1, the wide-area detector 230 is arranged in a position where the distance from the beam separator 214 is nearer (shorter) than the multi-detector 222. Accordingly, the influence of deviation of the angle of the traveling direction of secondary electrons bent by the beam separator 214 on the positional deviation can significantly be reduced. The wide-area detector 230 has a detection surface of a wide-area size capable of, if the adjustment of the primary electron optics and the adjustment of the beam separator 214 have been completed, detecting secondary electrons emitted from any of the whole irradiation regions of the multiple beams 20. Therefore, even when the position on the substrate 101 subjected to the irradiation with each of the multiple beams 20 is deviated, secondary electrons corresponding to at least any one of the beams can easily be detected by the wide-area detector 230. The primary electron optics of the multiple beams 20 is adjusted such that each beam reaches the desired irradiation position with the same setting value, but if at least one beam can be adjusted, remaining beams can also be brought closer to the desired positions. As a result, detection of secondary electrons corresponding to the remaining beams can also be enabled by the wide-area detector 230.

As the primary electron beam extraction process (S104), beams are extracted one by one from beams (primary electron beams) in a plurality of preset positions of the multiple beams 20 (multiple primary electron beams). As described above, the primary electron optics of the multiple beams 20 is adjusted such that each beam reaches the desired irradiation position with the same set value. Thus, beams are adjusted one by one. Thus, it is necessary to extract each beam one by one from the multiple beams 20. For example, the central beam and beams at four corners of the multiple beams 20 of $m_1$ columns×$n_1$ tiers are sequentially extracted.

Here, in Embodiment 1, in addition to the collective blanking deflection of the multiple beams 20 by the collective blanking deflector 212, an individual blanking deflection of each beam of the multiple beams 20 by the blanking aperture array mechanism 204 is enabled.

Figure 4:
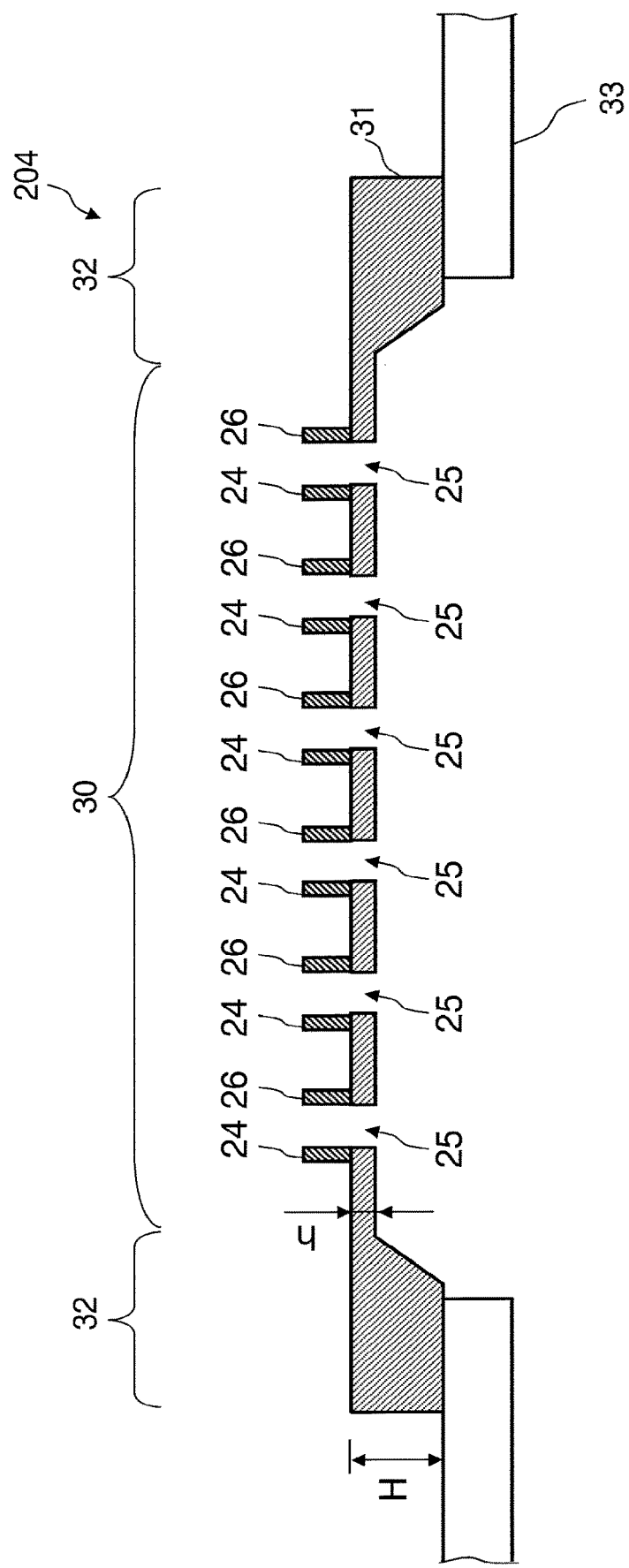
FIG. 4 is a sectional view showing the configuration of a blanking aperture array mechanism according to Embodiment 1.

FIG. 4 is a sectional view showing the configuration of a blanking aperture array mechanism according to Embodiment 1. The blanking aperture array mechanism 204 has, as shown in FIG. 4, a substrate 31 made of, for example, silicon arranged on a fulcrum 33. The central portion of the substrate 31 is, for example, thinly cut from the back side and processed into a membrane region (first region) of a thin thickness h. The periphery surrounding the membrane region 30 is an outer circumferential region 32 (second region) of a thick thickness H. The top surface of the membrane region 30 and the top surface of the outer circumferential region 32 are suitably formed so as to have the same height or substantially the same height. The substrate 31 is held on the fulcrum 33 by the back side of the outer circumferential region 32. The central portion of the fulcrum 33 is open and the membrane region 30 is positioned in a region where the fulcrum 33 is open.

The membrane region 30 has a passing hole 25 (opening) for passing of each of the multiple beams 20 opened in a position corresponding to each of the holes 22 of the shaping aperture plate array substrate 203 shown in FIG. 2. In other words, in the membrane region 30 of the substrate 31, a plurality of passing holes 25 through which corresponding beams of multiple beams using electron beams pass are formed in an array shape. Then, each of a plurality of electrode pairs having two electrodes is arranged at a set of positions in the membrane region 30 of the substrate 31 and facing each other across the corresponding passing hole 25 of the plurality of passing holes 25. More specifically, as shown in FIG. 4, a pair (blanker: blanking deflector) of a control electrode 24 and a counter electrode 26 for blanking deflection is arranged at neighborhood positions of each of the passing holes 25 across the relevant passing holes 25 in the membrane region 30. Further, a wire (not shown) for applying a deflection voltage to the control electrode 24 for each of the passing holes 25 is formed on the substrate 31. ON/OFF of individual deflection voltage application to each of the control electrodes 24 is controlled by the blanking control circuit 126. In addition, the counter electrode 26 for each beam is ground-connected.

Figure 5:
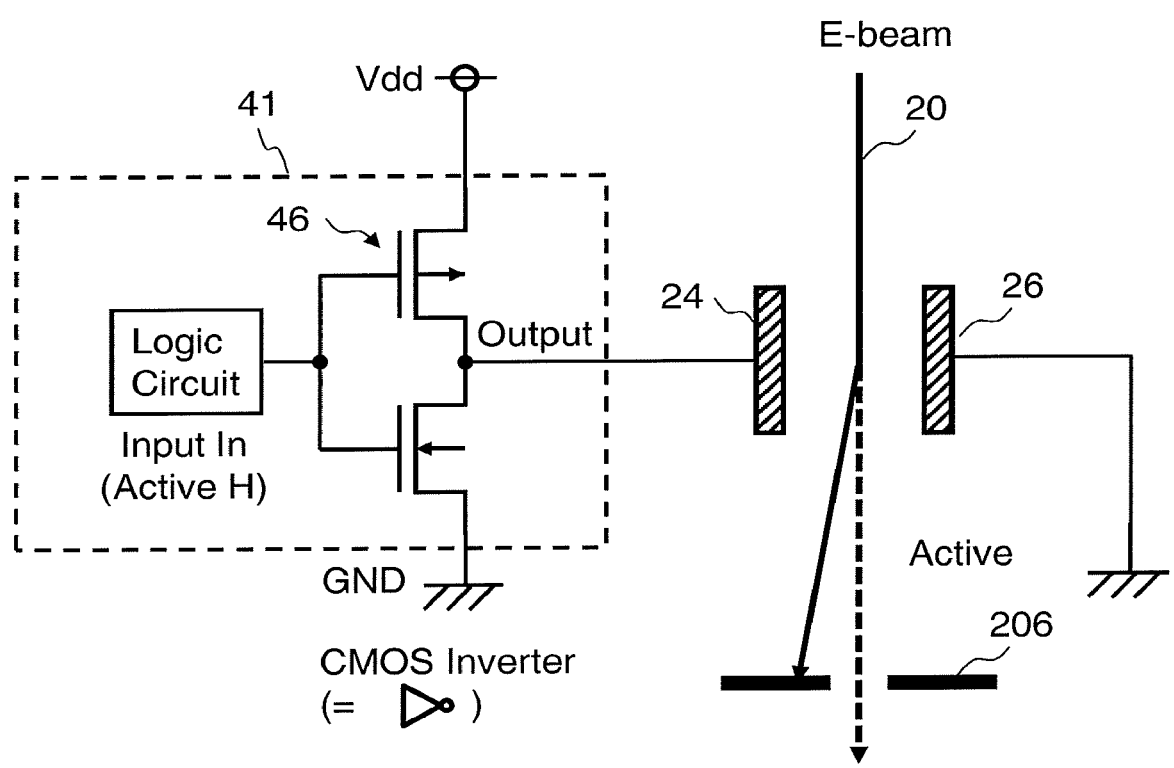
FIG. 5 is a diagram showing an example of an individual blanking mechanism according to Embodiment 1.

FIG. 5 is a diagram showing an example of the individual blanking mechanism according to Embodiment 1. In FIG. 5, an individual control circuit 41 for individually applying a deflection voltage to each of the control electrodes 24 is formed inside the blanking control circuit 126. In each of the control circuits 41, an amplifier 46 (an example of a switching circuit) is arranged. In the example of FIG. 5, a CMOS (Complementary MOS) inverter circuit is arranged as an example of the amplifier 46. Then, the CMOS inverter circuit is connected to a positive potential (Vdd: blanking potential: first potential) (for example, 5 V) (first potential) and a ground potential (GND: second potential). An output line (OUT) of the CMOS inverter circuit is connected to the control electrode 24. On the other hand, the ground potential is applied to the counter electrode 26.

Either a L (low) potential (for example, the ground potential) lower than the threshold voltage or an H (high) potential (for example, 1.5 V), which is equal to or higher than the threshold voltage, is input to the input (IN) of the CMOS inverter circuit as a control signal. In Embodiment 1, the output (OUT) of the CMOS inverter circuit is at a positive potential (Vdd) while the L potential is applied to the input (IN) of the CMOS inverter circuit, and the corresponding beam 20 is controlled to be in a beam OFF state by deflecting the corresponding beam 20 by an electric field created by a potential difference from the ground potential of the counter electrode 26 and shielding the corresponding beam 20 by the limiting aperture plate substrate 206. On the other hand, the output (OUT) of the CMOS inverter circuit is at the ground potential while the H potential is applied to the input (IN) of the CMOS inverter circuit (active state), and there is no potential difference from the ground potential of the counter electrode 26 and the corresponding beam 20 is not deflected, so that the corresponding beam 20 is controlled to be in a beam ON state by causing the corresponding beam 20 to pass through the limiting aperture plate substrate 206.

The electron beam 20 passing through each passing hole is individually deflected by the voltages applied to the control electrode 24 and the counter electrode 26 forming a pair independently. Blanking control is exercised by such deflection. More specifically, a pair of the control electrode 24 and the counter electrode 26 individually deflects by blanking corresponding beams of the multiple beams by the potential switched by the corresponding CMOS inverter circuit as a switching circuit. Thus, a plurality of blankers deflects by blanking a corresponding beam of the multiple beams having passed through a plurality of holes 22 (openings) of the shaping aperture plate array substrate 203.

As the individual blanking mechanism, the CMOS circuit as described above may not be formed on the substrate in the blanking control circuit 126. For example, control may be exercised by arranging a simple power supply circuit including a DC power supply and a relay circuit inside the blanking control circuit 126 and applying a desired potential to each electrode of the blanking aperture array mechanism 204 from the blanking control circuit 126. Further, a driving circuit such as the CMOS circuit described above may also be directly formed in the individual blanking aperture array mechanism in which the blanking electrodes 24, 26 and the passing holes are formed.

In Embodiment 1, as described above, beams are extracted one by one by deflecting the multiple beams such that remaining beams other than one desired beam of the multiple beams 20 are beam OFF using the substrate 31 having the plurality of passing holes 25 formed by matching positions through which the multiple beams 20 pass and the blanking aperture array mechanism 204 having the electrode pairs (24, 26) arranged for each of the passing holes 25 at positions facing each other across the relevant passing holes 25.

The individual blanking control of each beam by the blanking aperture array mechanism 204 is used when adjusting the optical system of the inspection apparatus 100. During normal pattern inspection after adjustments of the optical system, all beams are controlled to be beam ON. During normal pattern inspection, beam ON/OFF of the multiple beams 20 is collectively controlled by the collective blanking deflector 212. It is also possible to perform the same operation as that of the collective blanking deflector 212 by synchronizing each blanker of the blanking aperture array mechanism 204 to exercise ON/OFF control of all beams at the same timing. In such a case, the collective blanking deflector 212 may be omitted.

Figure 6:
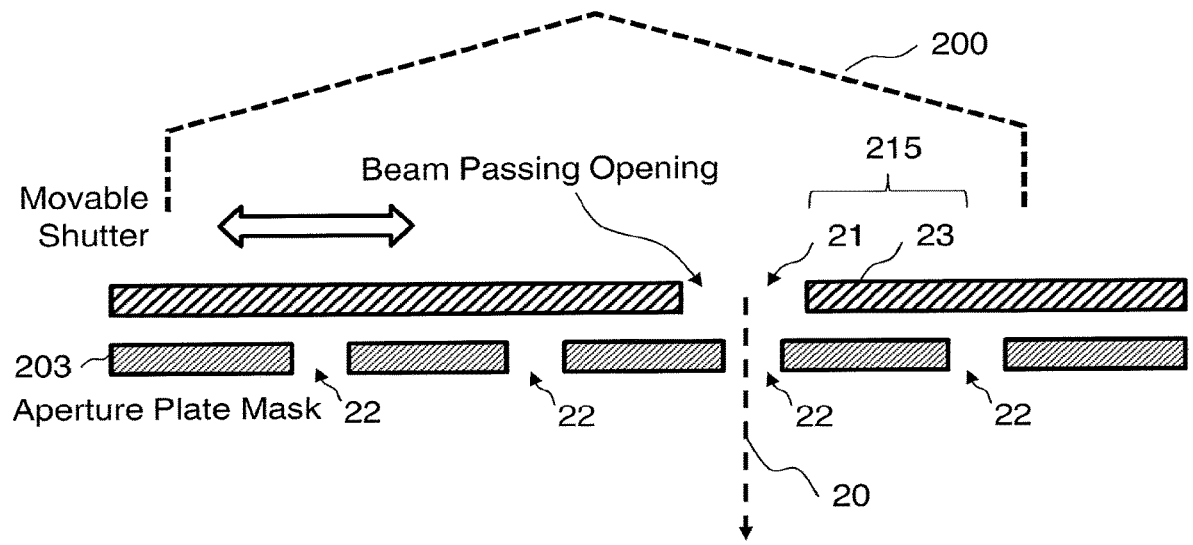
FIG. 6 is a diagram showing another example of an individual beam extraction mechanism according to Embodiment 1.

FIG. 6 is a diagram showing another example of the individual beam extraction mechanism according to Embodiment 1. In FIG. 6, a case where a shutter mechanism 215 is disposed instead of the blanking aperture array mechanism 204 is shown. It is also suitable to configure such that one beam is extracted from the multiple beams 20 by the shutter mechanism 215. The shutter mechanism 215 includes a shutter plate 23 in which at least one opening 21 smaller than the size obtained by subtracting the diameter size of the hole 22 from the arrangement pitch of the plurality of holes 22 formed in the shaping aperture plate array substrate 203 and larger than the size of each of the holes 22 is formed. Thus, the primary electron beams are extracted one by one by using the movable shutter mechanism 215 that includes the opening 21 allowing a desired one beam of the multiple beams 20 to pass through while shielding the remaining beams. More specifically, when the shutter plate 23 and the shaping aperture plate array substrate 203 are overlaid, the opening 21 fits perfectly with one of the plurality of holes 22 by moving the shutter plate 23 in a plane using a driving mechanism (not shown) of the shutter mechanism 215 to arrange the opening 21 at a position where the other holes 22 are shielded by the shutter plate 23. Conversely, by moving the shutter plate 23 in a plane direction, all the holes 22 are opened so that the beam can pass through. Here, the shutter plate 23 is suitably disposed above the shaping aperture plate array substrate 203. Accordingly, the portion of the electron beams 200 other than one beam passing through the opening 21 can be shielded by the shutter plate 23 so that unnecessary electron beam energy is not applied to the shaping aperture plate array substrate 203. Accordingly, shape deterioration such as deformation of the hole 22 that determines the size of the multiple beams 20 can be suppressed.

As the primary electron beam position coarse adjustment process (S106), coarse adjustments of the irradiation position of one extracted beam is sequentially made. Even if the setting of the beam separator 214 is completed, if the irradiation position of one beam extracted from the multiple beams 20 deviates too far from the design position, it is difficult even for the wide-area detector 230 to detect secondary electrons. Therefore, coarse adjustments of the irradiation position of each extracted beam are first made sequentially. More specifically, focal point adjustments, astigmatism corrections, and irradiation point adjustments are made.

Figure 7:
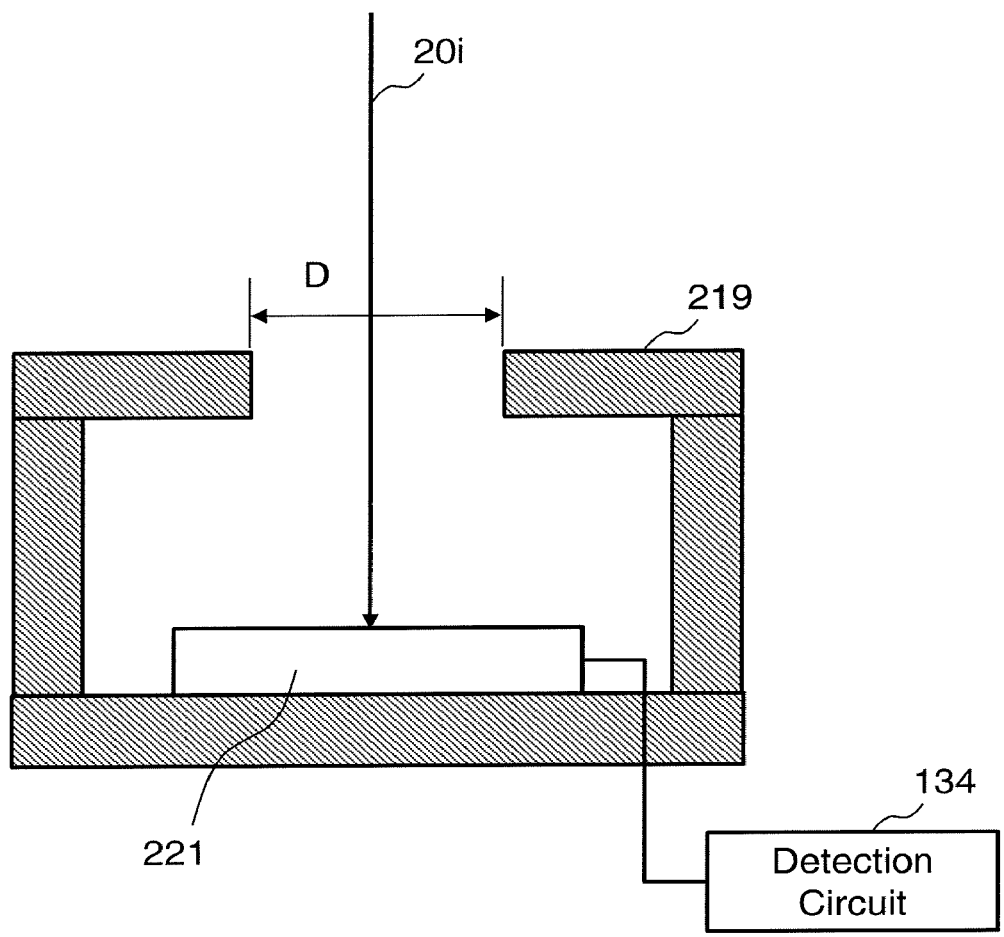
FIG. 7 is a sectional view showing an example of the configuration of a transmission mark in Embodiment 1.

FIG. 7 is a sectional view showing an example of the configuration of a transmission mark in Embodiment 1. In the example of FIG. 7, a through hole having a diameter D is formed on the upper surface of the transmission mark 219. The diameter D of the through hole is suitably smaller than the inter-beam pitches Px' (and Py') of the multiple beams 20. However, since coarse adjustments are made here, the size may be a size for several pitches, for example. Then, the height position of the upper surface of the transmission mark 219 is adjusted so as to be the same as that of the upper surface of the substrate 101. Inside the transmission mark 219, a region located below the through hole formed on the upper surface is formed as a cavity, and a beam 20i having passed through the through hole and intended for measurement enters a current detector 221. Then, the current detector 221 measures the current value of the beam 20i that has entered. The data detected by the current detector 221 is output to the detection circuit 134 and then output to the position circuit 107, after being converted from analog data into digital data. The transmission mark 219 is scanned by the extracted beam 20i. First, the XY stage 105 is moved such that the transmission mark 219 is positioned within the scanning range of the extracted beam 20i. Scanning by the extracted beam 20i can be performed by deflecting using the deflector 208. Then, the peak position of intensity of the current value data can be detected as the position of the beam.

Then, coarse adjustments of the position of the relevant beam are made by making coarse adjustments of the primary electron optics in such a way that the position of the beam to be detected falls within a preset threshold value from the design position. In order to adjust the position of a beam, in addition to each electromagnetic lens constituting the primary electron optics, an alignment coil (not shown) may also be used.

As the secondary electron trajectory coarse adjustment process (S110), secondary electrons emitted by irradiation of one beam extracted from the multiple beams 20 are coarsely adjusted to a trajectory detectable by the wide-area detector 230. More specifically, setting values of the beam separator 214 are adjusted. By adjusting the intensity of the electric field and the magnetic field generated by the beam separator 214, the direction to which a beam is bent can be adjusted.

Figure 8:
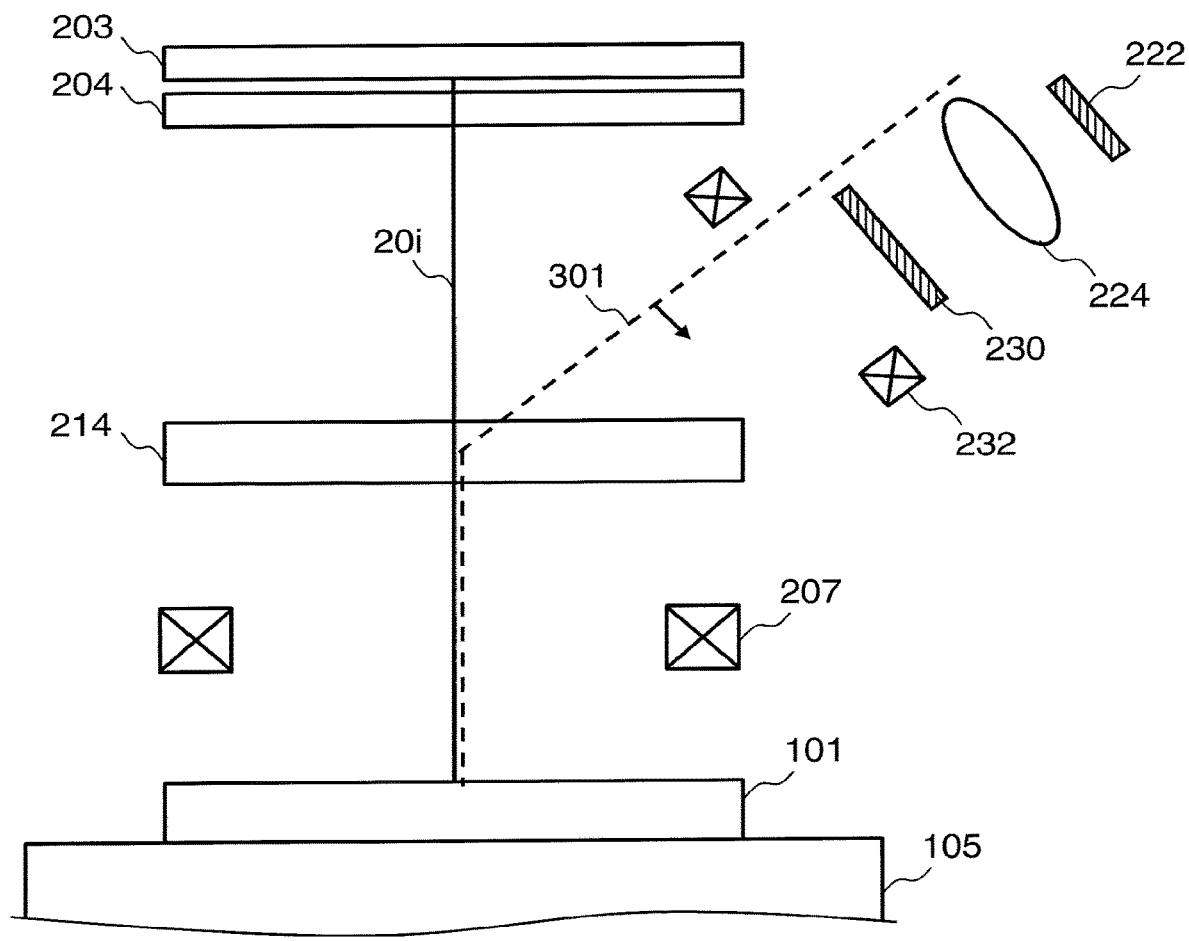
FIG. 8 is a diagram describing how to coarsely adjust a secondary electron trajectory in Embodiment 1.

FIG. 8 is a diagram describing how to coarsely adjust a secondary electron trajectory in Embodiment 1. Since the primary electron beam position coarse adjustment process (S106) using the transmission mark 219 has already been completed, secondary electrons 301 whose trajectory has been bent by the beam separator 214 frequently reach the detection surface of the wide-area detector 230 by matching the settings of the beam separator 214 to the design values. In particular, when the central beam of the multiple beams 20 is used as the target beam, the secondary electrons 301 normally reach the detection surface of the wide-area detector 230. However, when a beam cannot be detected by the wide-area detector 230, the setting values of the beam separator 214 are adjusted so that the secondary electrons 301 emitted by the irradiation of the target beam are caused to hit the detection surface of the wide-area detector 230. If it is difficult to cause the secondary electrons 301 to hit the detection surface of the wide-area detector 230 only by adjusting the beam separator 214, the alignment coil 232 may be used to cause the trajectory of the secondary electrons 301 to hit the detection surface of the wide-area detector 230. Whether or not the detection surface of the wide-area detector 230 is hit can be determined by whether or not the secondary electrons 301 could be detected by the wide-area detector 230.

Figure 9:
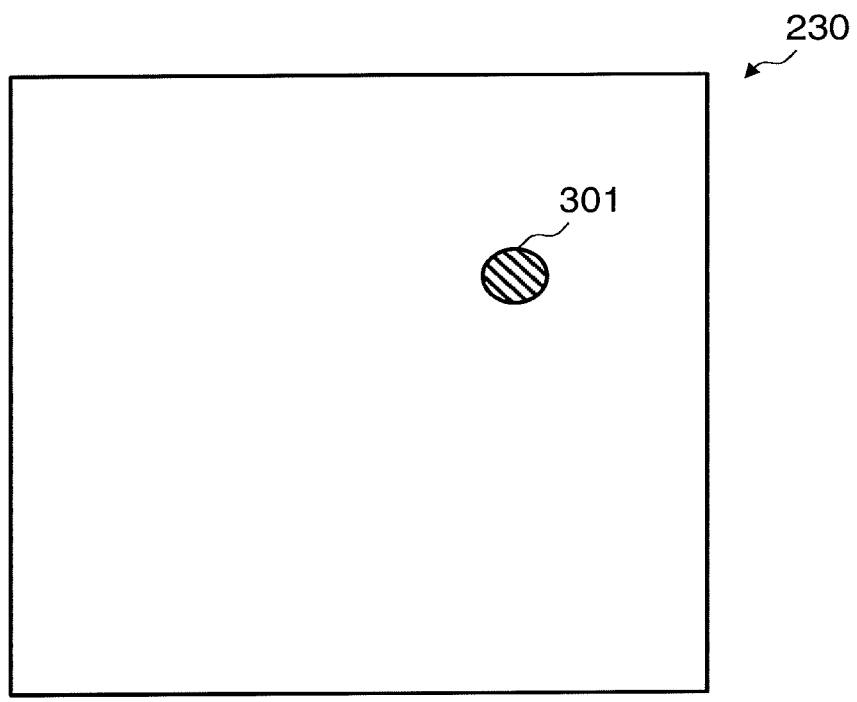
FIG. 9 is a diagram showing an example of a detection position by a wide-area detector according to Embodiment 1.

FIG. 9 is a diagram showing an example of a detection position by a wide-area detector according to Embodiment 1. In the example of FIG. 9, a case where the secondary electrons 301 are detected at a position slightly above and to the right of the rectangular detection surface of the wide-area detector 230 is shown. Since the detection surface of the wide-area detector 230 has a wide-area size as described above, it is easy to detect the secondary electrons 301 but, on the other hand, it is not possible to identify the detection position at which position on the detection surface the secondary electrons were detected. Therefore, it is not possible for the trajectory of the secondary electrons 301 to reach the desired position of the multi-detector 222 in an untouched state. However, a secondary electron image on the target object surface by the secondary electrons 301 obtained by further scanning primary electrons can be acquired by being able to detect the secondary electrons 301 of the target beam by the wide-area detector 230.

As the primary electron beam adjustment process (S112), for each beam (primary electron beam) extracted one by one by using the wide-area detector 230 (second detector), the secondary electrons 301 corresponding to the relevant beam are detected by the wide-area detector 230 and at the same time, the trajectory of the target beam is adjusted using the primary electron optics.

Figure 10:
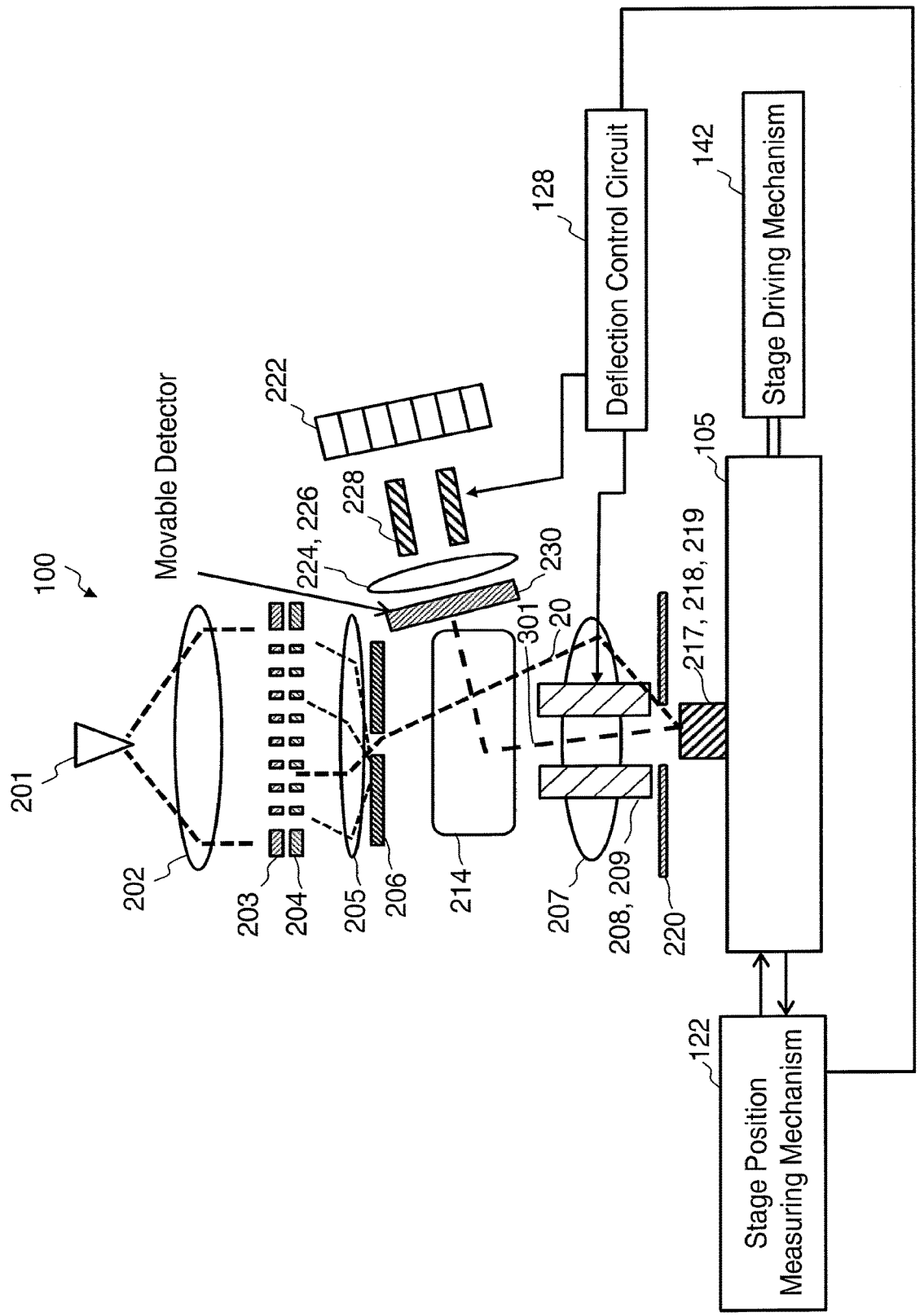
FIG. 10 is a diagram describing adjustments of a primary electron optics according to Embodiment 1.

FIG. 10 is a diagram describing adjustments of the primary electron optics according to Embodiment 1. In FIG. 10, in order to simplify the description, a portion of the primary electron optics is not shown. Adjustments of the primary electron optics are made for each beam. Here, it is suitable to first make adjustments using the central beam of the multiple beams 20 and then, to make adjustments using the beams at four corners of the multiple beams 20 one by one. However, the present embodiment is not limited to such an example. Adjustments may be made using only the beams at each of the four corners of the multiple beams 20 one by one without using the central beam of the multiple beams 20. Alternatively, adjustments may be made using other beams of the multiple beams 20 one by one. In FIG. 10, the target beam extracted as only one beam by the blanking aperture array mechanism 204 passes through the reduction lens 205, the limiting aperture plate substrate 206 and the like before one of the marks 217, 218, 219 is irradiated therewith by the objective lens 207. In Embodiment 1, coarse adjustments of the primary electron beam position are made by, as described above, scanning the transmission mark 219. In the adjustments (fine adjustments) of the primary electron beam, for example, the irradiation position and the focal point are adjusted and the astigmatism is corrected. The adjustments (fine adjustments) of the primary electron beam position are made by scanning the mark 217 on which a position measuring pattern is formed. The focal point of the primary electron beam is adjusted by scanning the mark 218 on which a focal point adjusting pattern is formed. In the focal point adjustments and astigmatism corrections, adjustments of excitation of the objective lens 207 are used for the overall focal point adjustments and for the overall astigmatism corrections, in addition to using a stigmator (not shown), an aberration corrector for individual beams (not shown) can be used. Also, for a portion of distortion aberration by a lens system in the distribution of beam position, in addition to adjustments of excitation of the illumination lens 202, the aberration corrector for individual beams (not shown) can be used.

Figure 11:
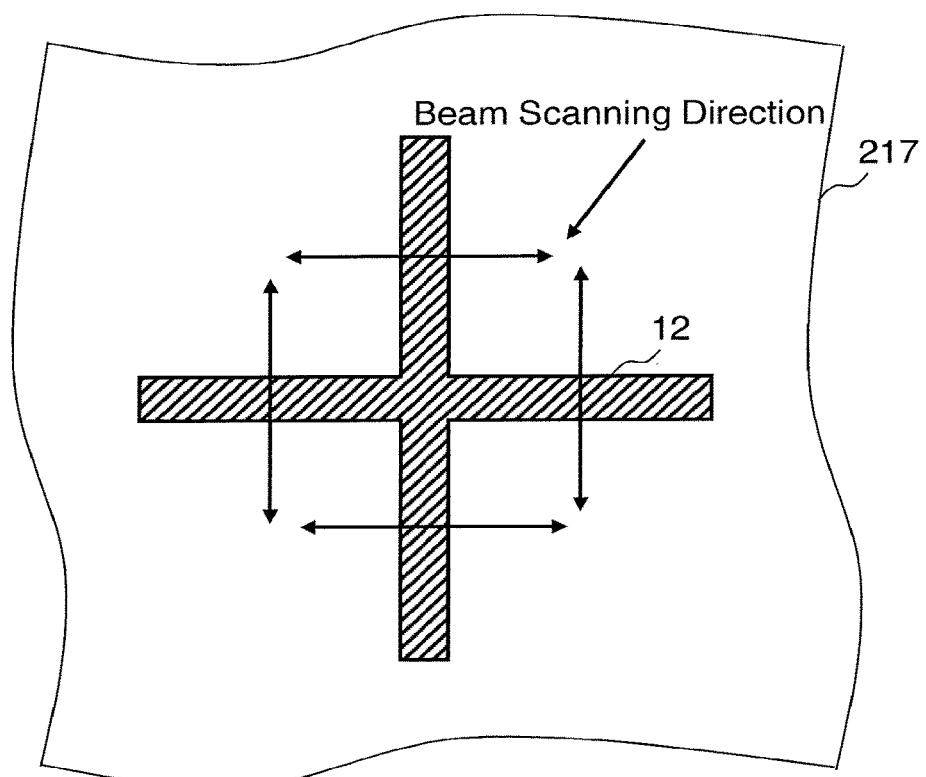
FIG. 11 is a diagram showing an example of a position measuring pattern according to Embodiment 1.

FIG. 11 is a diagram showing an example of a position measuring pattern according to Embodiment 1. On the surface of the mark 217, as shown in FIG. 11, a cross mark pattern is formed as a position measuring pattern 12. Then, first, the XY stage 105 is moved such that the cross mark pattern of the mark 217 is positioned within the scanning range of the extracted beam 20i. Then, the mark 217 is scanned by the extracted beam 20i. Scanning by the extracted beam 20i can be performed by deflecting using the deflector 208. Two positions are scanned in each of the x direction and the y direction across the center of the cross mark pattern to detect secondary electrons emitted from the mark 217 by the wide-area detector 230. Detection data (secondary electron image) of the secondary electrons 301 detected by the wide-area detector 230 is output to the detection circuit 106 in the order of measurement. Inside the detection circuit 106, analog detection data is converted into digital data by an A/D converter (not shown) and stored in the pattern memory 123. Then, the detection data is transferred to the position circuit 107 via the comparison circuit 108. In the position circuit 107, since four scanning positions are separately measured by the laser length measuring system 122, the position of an intersection of a line connecting two peak positions in the x direction and a line connecting two peak positions in the y direction of image intensity is measured as the irradiation position of the extracted target beam 20i. Then, the lens control circuit 124 adjusts various lenses constituting the primary electron optics such that the irradiation position of the target beam 20i becomes a desired position (design position). For example, by adjusting the refraction angle of a beam, the irradiation position of the final target beam 20i in the surface height of the substrate 101 is adjusted. For the position adjustment of a beam, in addition to each electromagnetic lens constituting the primary electron optics, an alignment coil (not shown) may also be used for deviation of an optical axis or the like. Next, the focal point is adjusted.

Figure 12:
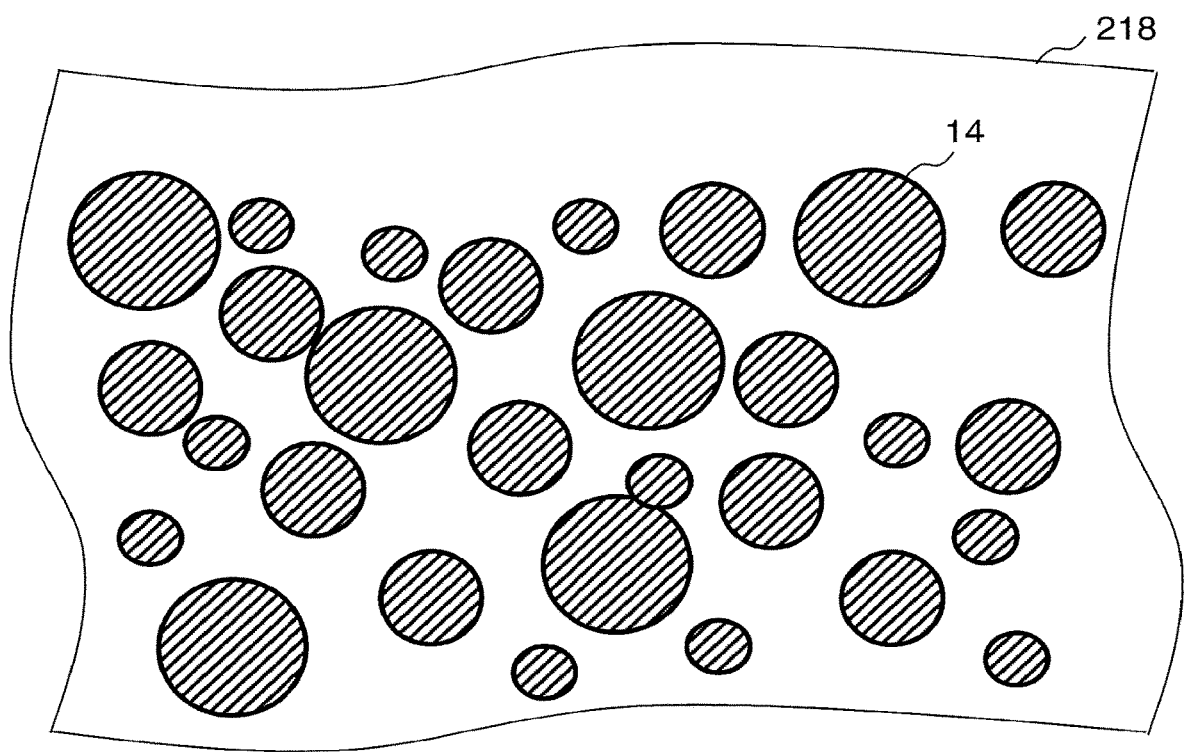
FIG. 12 is a diagram showing an example of a focal point adjusting pattern according to Embodiment 1.

FIG. 12 is a diagram showing an example of a focal point adjusting and astigmatism correcting pattern according to Embodiment 1. On the surface of the mark 218, as shown in FIG. 12, a plurality of circular patterns having different sizes is formed as focal point adjusting patterns 14. The sizes of the plurality of circular patterns are formed from a size less than the resolution limit to a size larger than the resolution limit across the desired beam resolution. For example, circular patterns can be formed by dispersing fine particles of gold on a carbon material. Then, first, the XY stage 105 is moved such that the focal point adjusting pattern 14 of the mark 218 is positioned within the scanning range of the extracted beam 20i. Then, the mark 218 is scanned by the extracted beam 20i. Scanning by the extracted beam 20i can be performed by deflecting using the deflector 208. After scanning, secondary electrons emitted from the mark 218 are detected by the wide-area detector 230. Detection data (secondary electron image) of the secondary electrons 301 detected by the wide-area detector 230 is output to the detection circuit 106 in the order of measurement. Inside the detection circuit 106, analog detection data is converted into digital data by an A/D converter (not shown) and stored in the pattern memory 123. Then, the detection data is transferred to the lens control circuit 124 via the comparison circuit 108. The lens control circuit 124 adjusts the focal point of the target beam 20i to the surface height of the substrate 101 using the objective lens 207 so as to obtain an image having a desired beam resolution among a plurality of circular patterns.

As described above, adjustments (the irradiation position and focal point) of the trajectory of the beam extracted using the primary electron optics are made. By further increasing the number of lenses, it is possible to adjust magnification, rotation, astigmatism, etc. of the beam. The positions and current distributions of the primary electron beam thus obtained and also individual beam shapes and the like are stored in a memory (not shown) and used for inspection.

In addition to the above-described method, for example, in the example of FIG. 1, it is also possible to finely adjust the positions of individual beams by adopting a configuration in which a deflection electrode array in which a set of deflectors are assigned to one beam is provided downstream of the blanking aperture array 204. As the structure of the deflection electrode array, a system in which two or four pairs of deflection electrodes are arranged so as to surround an opening and a predetermined potential is applied to each electrode to generate a deflection electric field and to bend a beam trajectory is desirable as a configuration similar to that of the blanking aperture plate array. Though the adjustment accuracy of individual beams is somewhat inferior, it is also possible to reduce the number of necessary power supplies by adopting a system that allocates a plurality of beams to a set of deflectors. The wire to each electrode is connected to the outside of the deflection electrode array substrate and is connected to an individual deflection adjustment power supply (not shown) installed in the atmosphere. Voltages are supplied from the individual deflection adjustment power supply such that each electrode obtains a predetermined potential.

Then, the primary electron optics is adjusted such that when each process from the primary electron beam extraction process (S104) to the primary electron beam adjustment process (S112) is performed for the central beam and the four corner beams of the multiple beams 20, comparable secondary electron images are each obtained under the same lens conditions for the whole of the multiple beams 20. By making such adjustments, the irradiation position and the focal point of the multiple beams 20 are aligned (the adjustment of the primary electron optics is completed). Also, by making such adjustments, each secondary electron outside the multiple secondary electrons 300 is detected so that it is already possible to detect the whole of the multiple secondary electrons 300 by the wide-area detector 230.

Here, though it is possible to detect the secondary electrons 301 on the detection surface of the wide-area detector 230 shown in FIG. 9 described above, it is difficult to identify the position thereof. Thus, when guiding the corresponding secondary electrons 301 of all beams at the four corners of the multiple beams 20 into the detection plane of the wide-area detector 230, it is necessary to make adjustments while assuming respective positions, which correspondingly takes time and effort.

Figure 13:
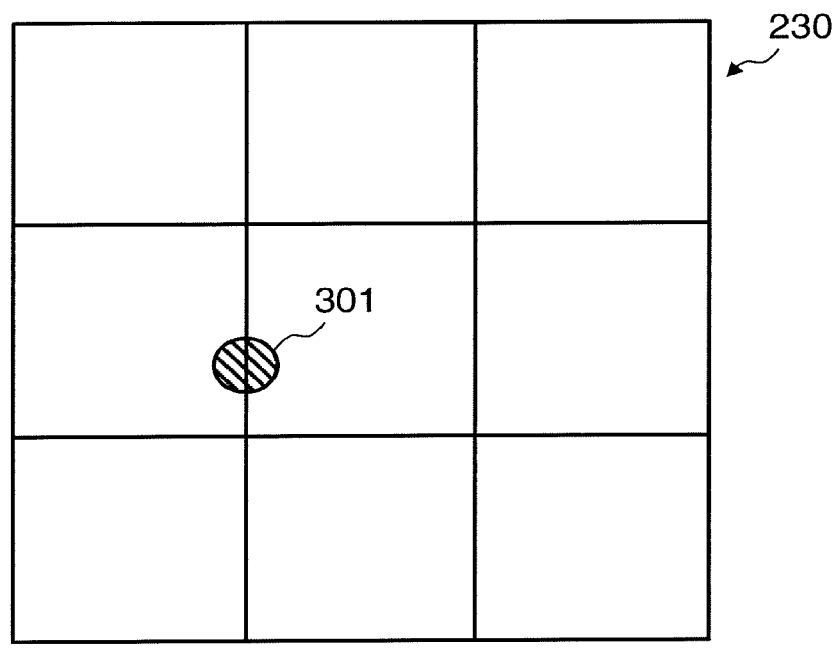
FIG. 13 is a diagram showing another example of the wide-area detector according to Embodiment 1.

FIG. 13 is a diagram showing another example of the wide-area detector according to Embodiment 1. In the example shown in FIG. 13, a case where a region division type detector is used as the wide-area detector 230 is shown. Here, for example, a 9-division type detector whose detection surface is 3×3 is used. For example, when the central beam of the multiple beams 20 is extracted, it is possible to make adjustments such that the secondary electrons 301 of the central beam are detected on the center region plane out of the 3×3 nine division planes. Similarly, it is possible to make adjustments such that, among the beams at the four corners of the multiple beams 20, the beam at the upper right corner is detected on, for example, the upper right region surface of the 3×3 nine division planes. Similarly, it is possible to make adjustments such that the beam at the lower right corner is detected on, for example, the lower right region surface of the 3×3 nine division planes. Similarly, it is possible to make adjustments such that the beam at the upper left corner is detected on, for example, the upper left region surface of the 3×3 nine division planes. Similarly, it is possible to make adjustments such that the beam at the lower left corner is detected on, for example, the lower left region surface of the 3×3 nine division planes. If adjustments are made in this manner such that a beam is sequentially detected on the detection surface corresponding to the respective positions, the respective positions can roughly be known when guiding the beam into the detection surface of the wide-area detector 230 and thus, time and effort for adjustments can be saved while assuming the position.

When the adjustments of the primary electron optics are completed as described above, adjustments of the secondary electron optics are next made.

As the wide-area detector unloading process (S114), the driving mechanism 132 moves the wide-area detector 230 from the optical path to the outside of the optical path under the control of the loading/unloading control circuit 130. Accordingly, the multiple secondary electrons 300 can be advanced onto the optical path of the secondary electron optics.

As the primary electron beam extraction process (S116), beams (primary electron beams) at a plurality of preset positions are extracted one by one from the multiple beams 20 (multiple primary electron beams). To extract each beam, the blanking aperture array mechanism 204 may control the target beam as beam ON and all remaining beams as beam OFF. It is suitable to first adjust the central beam of the multiple beams 20.

As the secondary electron trajectory adjustment process (S118), after the adjustments of the trajectory in the primary electron optics of each beam (primary electron beam) extracted one by one are completed, the wide-area detector 230 is moved from the optical path to the outside of the optical path and then, in a state that the wide-area detector 230 has been moved from the optical path to the outside of the optical path, the trajectory of the secondary electrons 301 is adjusted using the secondary electron optics such that the secondary electrons 301 corresponding to the primary electron beam extracted one by one are detected in the corresponding region of the multi-detector 222.

Figure 14:
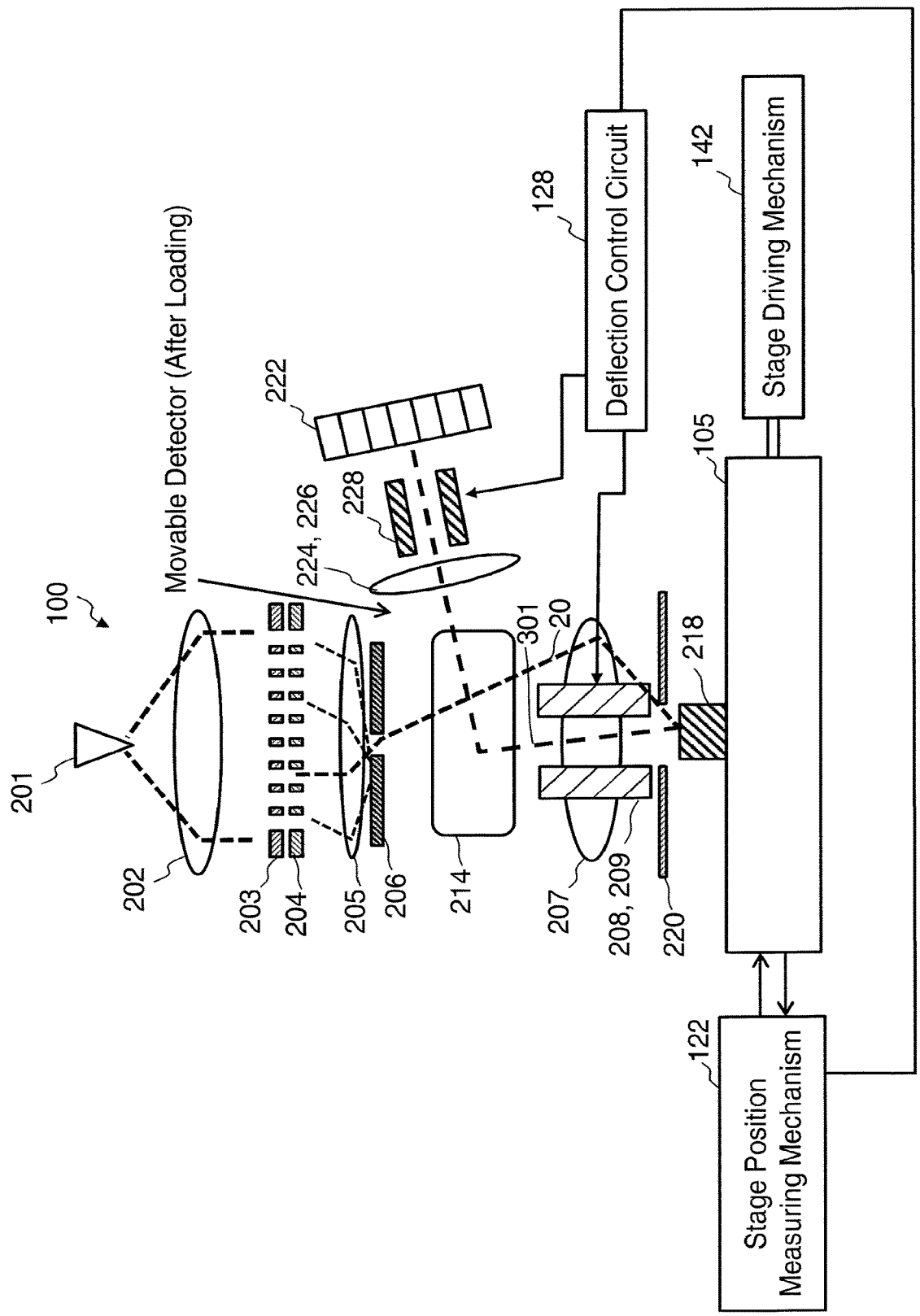
FIG. 14 is a diagram describing adjustments of a secondary electron optics according to Embodiment 1.

FIG. 14 is a diagram describing adjustments of the secondary electron optics according to Embodiment 1. In FIG. 14, in order to simplify the description, a portion of the primary electron optics is not shown. Adjustments of the secondary electron optics are made for each beam. Here, it is suitable to first make adjustments using the central beam of the multiple beams 20 and then, to make adjustments using the remaining beams one by one. However, the present embodiment is not limited to such an example. Adjustments may be started using other beams of the multiple beams 20 without using the central beam of the multiple beams 20. In FIG. 14, the target beam extracted as only one beam by the blanking aperture array mechanism 204 passes through the reduction lens 205, the limiting aperture plate substrate 206 and the like before the mark 218 is irradiated therewith by the objective lens 207. In the adjustments of the secondary electron optics, it is required that the secondary electrons 301 corresponding to each beam be detected by elements at a preset position of the multi-detector 222 and focusing on such a detection surface be obtained. The lens control circuit 124 adjusts various lenses constituting the secondary electron optics such that the corresponding secondary electrons 301 of the target beam 20i are detected at a desired position (design position) of the multi-detector 222.

For example, the XY stage 105 is moved such that the focal point adjusting pattern 14 of the mark 218 is positioned at the irradiation position of the extracted beam 20i. Then, the mark 218 is irradiated with the extracted beam 20i. The secondary electrons 301 emitted from the mark 218 are detected by the multi-detector 222. Detection data (secondary electron image) of the secondary electrons 301 detected by the multi-detector 222 is output to the detection circuit 106 in order of measurement. Inside the detection circuit 106, analog detection data is converted into digital data by an A/D converter (not shown) and stored in the pattern memory 123. Then, the secondary electron optics is adjusted such that the peak of the current distribution to be inspected becomes the preset element (position) of the multi-detector 222. For the position adjustment of a beam, in addition to the projection lenses 224, 226 constituting the secondary electron optics, the alignment coil 23 may also be used regarding deviation of an optical axis or the like. Next, the focal point is adjusted.

First, the XY stage 105 is moved such that the focal point adjusting pattern 14 of the mark 218 is positioned within the scanning range of the extracted beam 20i. Then, the mark 218 is scanned by the extracted beam 20i. Scanning by the extracted beam 20*i* can be performed by deflecting using the deflector 208. After scanning, the secondary electrons 301 emitted from the mark 218 are detected by the multi-detector 222. Detection data (secondary electron image) of the secondary electrons 301 detected by the multi-detector 222 is output to the detection circuit 106 in order of measurement. Inside the detection circuit 106, analog detection data is converted into digital data by an A/D converter (not shown) and stored in the pattern memory 123. Then, the detection data is transferred to the lens control circuit 124 via the comparison circuit 108. The lens control circuit 124 adjusts the focal point of the secondary electrons 301 of the target beam 20*i* to the detection surface height of the multi-detector 222 by the projection lens 226 so as to obtain an image having a desired beam resolution among a plurality of circular patterns.

As described above, adjustments (the irradiation position and focal point) of the trajectory of the secondary electrons 301 corresponding to the beam extracted using the secondary electron optics are made.

It is also possible to finely adjust the incident position of the primary beam so that the arrival position of secondary electrons approaches the desired position of the detection element of the multi-detector 222 by adjusting the incident position of the primary electron beam system. Further, when the primary electron beam system has individual deflector arrays and the incident position of a primary beam can individually be adjusted, the incident position of the primary beam can finely be adjusted such that the incident position of secondary electrons reaches the desired position of the detection element of the multi-detector 222.

Alternatively, a deflector array corresponding to individual secondary electron beams is provided also in the secondary electron system and adjustments are made such that the corresponding secondary electron beam passes through each opening of the deflector array for secondary electron beam. It is also possible to make fine adjustments such that secondary electrons reach the desired position of the detection element of the multi-detector 222. Alternatively, though the adjustment accuracy of individual beams is somewhat inferior, it is also possible to reduce the number of circuits by associating a plurality of secondary electron beams with each opening.

As the determination process (S120), the control computer 110 determines whether or not the adjustments have been completed for all the beams. Then, each process from the primary electron beam extraction process (S116) to the secondary electron beam adjustment process (S118) is repeated until the adjustments of all the beams are completed to adjust the secondary electron optics such that the multiple beams 20 as a whole are detected in respective desired detection regions of the multi-detector 222 and also comparable secondary electron images are respectively obtained. By making such adjustments, the irradiation position and the focal point of the multiple beams 20 are aligned (the adjustment of the secondary electron optics is completed).

In Embodiment 1, the adjustment of the primary electron optics allows the multiple secondary electrons 300 to proceed into the control range of the secondary electron optics and thus, the secondary electron optics can easily be adjusted. In fact, the adjustment can be made with little effort. Further, in Embodiment 1, after the adjustment of the primary electron optics, the secondary electron optics can be adjusted without opening the inside of the electron beam column 102 to the atmosphere.

By adjusting the optical systems of the inspection apparatus 100 as described above, a secondary electron image (SEM image) can be acquired. Then, using the acquired secondary electron image, the substrate 101 to be inspected is inspected.

Figure 15:
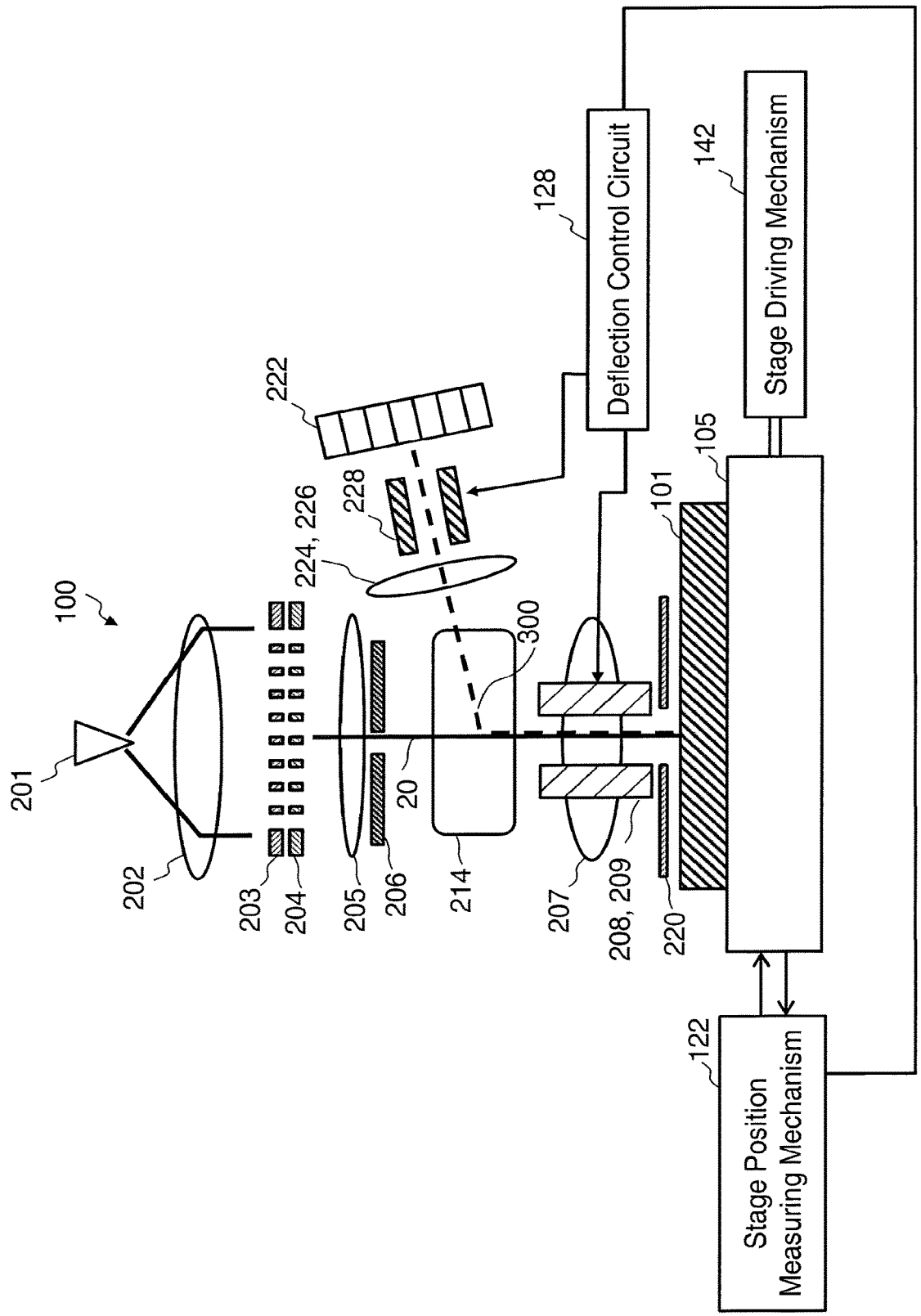
FIG. 15 is a diagram describing acquisition of a secondary electronic image in Embodiment 1.

FIG. 15 is a diagram describing acquisition of a secondary electronic image in Embodiment 1. In FIG. 15, in order to simplify the description, a portion of the primary electron optics is not shown. First, the substrate 101 to be inspected is placed on the XY stage 105. Then, as will be described below, the XY stage 105 is moved such that the substrate 101 is positioned within the irradiation range of the multiple beams 20. Then, as described above, the electron beam 200 emitted from the electron gun assembly 201 (emission source) illuminates the shaping aperture plate array substrate 203 as a whole almost vertically through the illumination lens 202. For example, a plurality of rectangular electron beams (multiple beams) 20*a* to 20*d* are formed by the shaping aperture plate array substrate 203. Then, the formed multiple beams 20*a* to 20*d* (primary electron beams) pass through the blanking aperture array mechanism 204 and are reduced by the reduction lens 205 before traveling toward a hole in the center formed in the limiting aperture plate substrate 206. After passing through the limiting aperture plate substrate 206, the multiple beams 20*a* to 20*d* pass through the reduction lens 213 (not shown) and the beam separator 214 before traveling to the objective lens 207. The multiple beams 20*a* to 20*d* are focused on the surface of the substrate 101 by the objective lens 207 to form an image of the multiple beams 20*a* to 20*d* (electron beams) on the substrate 101. At this point, the multiple beams are deflected collectively by the main deflector 208 and the sub deflector 209 before respective irradiation positions on the substrate 101 are irradiated therewith. The multiple secondary electrons 300 including reflected electrons and corresponding to each beam of the multiple beams 20 are emitted from the substrate 101 due to irradiation to the desired positions on the substrate 101 with the multiple beams 20.

The trajectory of the multiple secondary electrons 300 emitted from the substrate 101 is bent to the secondary electron optics by the beam separator 214. Then, the multiple secondary electrons 300 bent obliquely upward are projected onto the multi-detector 222 while being refracted by the projection lenses 224, 226 in a state where the wide-area detector 230 is not loaded onto the optical path. Thus, the image acquisition mechanism 150 acquires an image of the substrate 101 by, as described above, detecting the multiple secondary electrons 300 including reflected electrons and emitted from the substrate 101 due to irradiation to the substrate 101 with the multiple beams 20 (electron beams) focused on the substrate 101 using the objective lens 207. In addition to the contents described above, the image acquisition mechanism 150 operates as described below.

Figure 16:
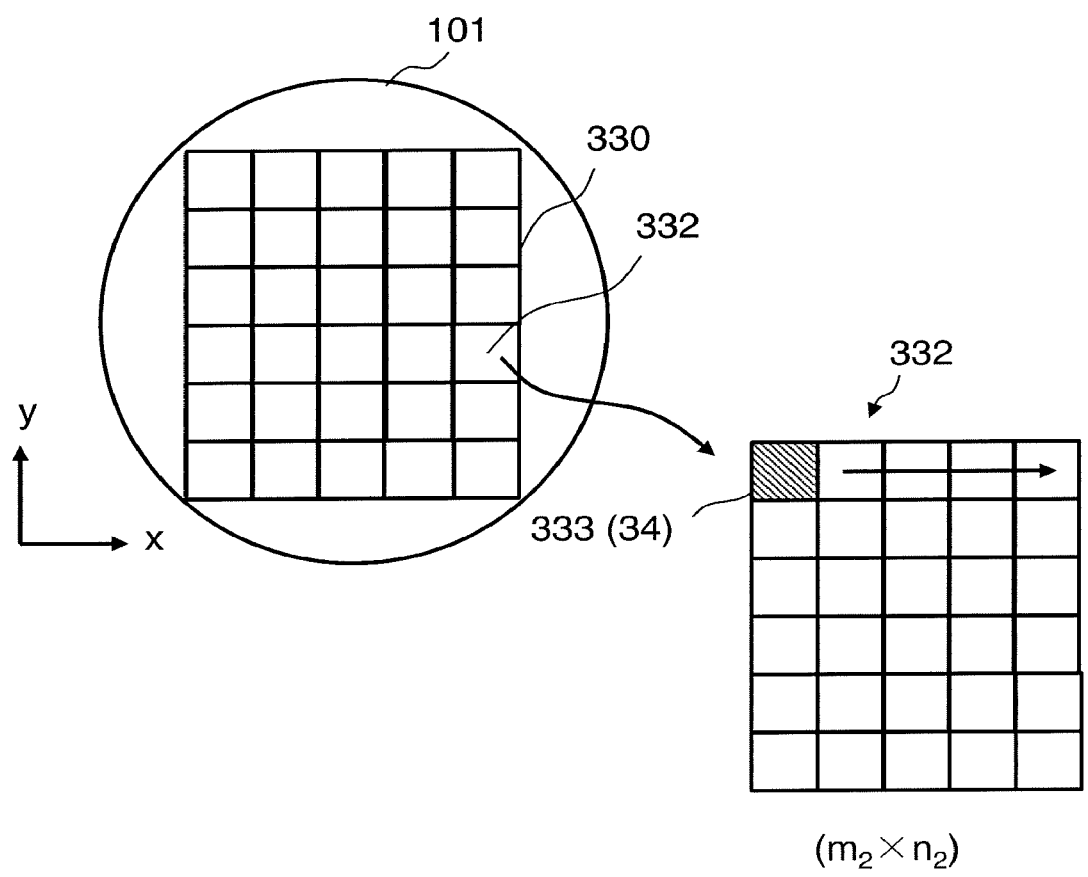
FIG. 16 is a diagram showing an example of a plurality of chip regions formed on a semiconductor substrate in Embodiment 1.

FIG. 16 is a diagram showing an example of a plurality of chip regions formed on a semiconductor substrate in Embodiment 1. In the example of FIG. 16, a case where the substrate 101 is a semiconductor substrate (wafer) is shown. In an inspection region 330 of the semiconductor substrate (wafer) 101, a plurality of chips (wafer dies) 332 is formed in a two-dimensional array. A mask pattern for one chip formed on the mask substrate for exposure has been transferred to each of the chips 332 after being reduced to, for example, ¼ by an exposure device (stepper) (not shown). The inside of each of the chips 332 is divided into, for example, a plurality of mask dies 333 in a two-dimensional shape of $m_2$ columns in the width direction (x direction)×$n_2$ tiers in the length direction (y direction) ($m_2$ and $n_2$ are integers of 2 or greater). In Embodiment 1, the mask die 333 becomes a unit inspection region.

Figure 17:
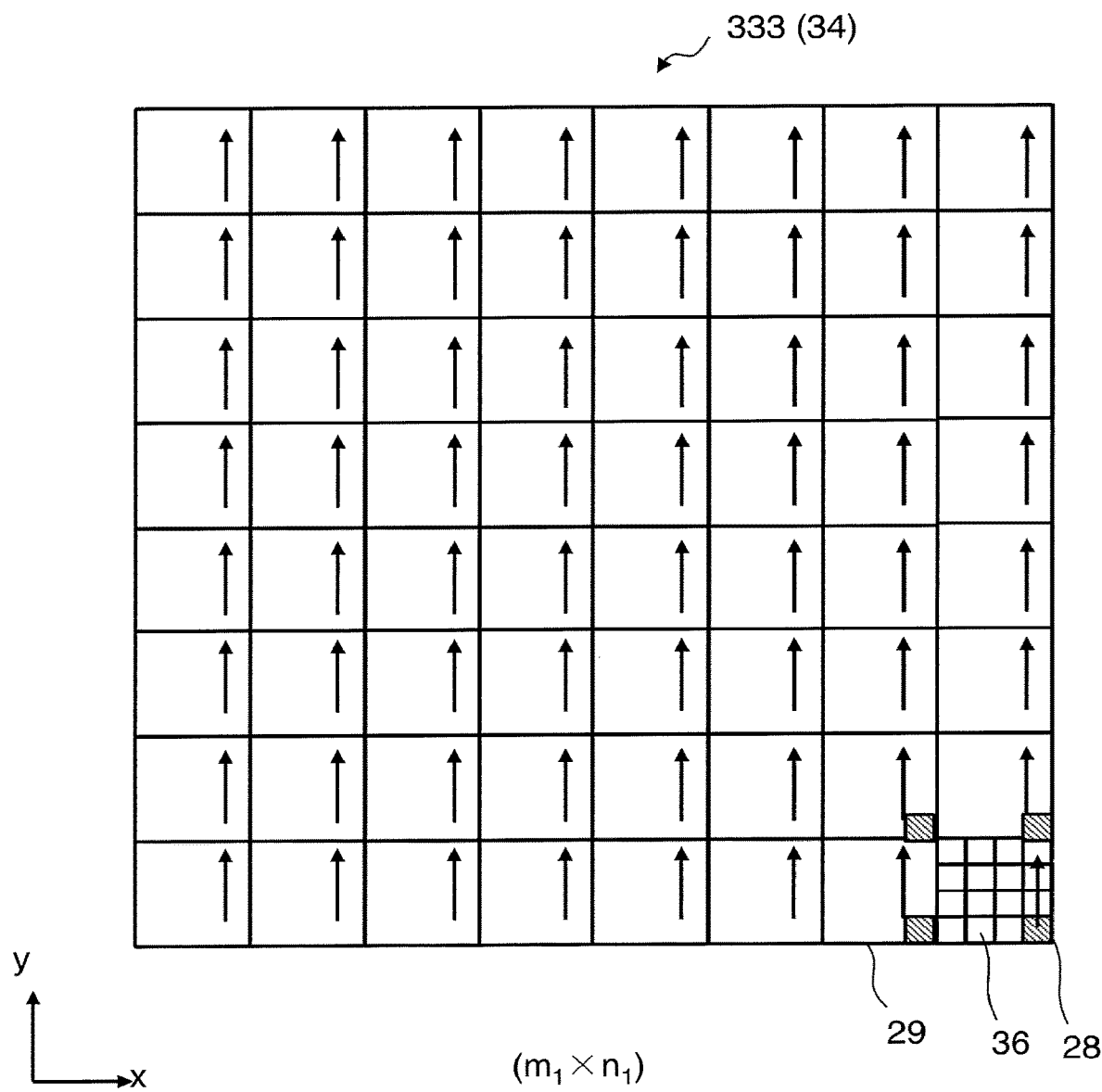
FIG. 17 is a diagram showing an example of an irradiation region and pixels for measurement of multiple beams in Embodiment 1.

FIG. 17 is a diagram showing an example of an irradiation region and pixels for measurement of multiple beams in Embodiment 1. In FIG. 17, each mask die 333 is divided into, for example, a plurality of mesh regions in a mesh shape of the beam size of the multiple beams. Each such mesh region becomes a pixel for measurement 36 (unit irradiation region). In the example of FIG. 17, a case of multiple beams of 8×8 rows is shown. An irradiation region 34 that can be irradiated with the multiple beams 20 at a time is defined by (the x-direction size obtained by multiplying the inter-beam pitch in the x direction of the multiple beams 20 by the number of beams in the x direction)×(the y-direction size obtained by multiplying the inter-beam pitch in the y direction of the multiple beams 20 by the number of beams in the y direction). In the example of FIG. 17, a case where the irradiation region 34 has the same size as the mask die 333 is shown. However, the present embodiment is not limited to such an example. The irradiation region 34 may be smaller than the mask die 333. Alternatively, the irradiation region 34 may be larger. Then, a plurality of pixels for measurement 28 (irradiation position of beams for one shot) that can be irradiated with the multiple beams 20 at a time is shown inside the irradiation region 34. In other words, the pitch between the pixels for measurement 28 adjacent to each other becomes the pitch between beams of the multiple beams. In the example of FIG. 17, a square region surrounded by the four pixels for measurement 28 adjacent to each other and containing one pixel for measurement 28 of the four pixels for measurement 28 constitutes a sub-irradiation region 29. The example of FIG. 17 shows a case where each of the sub-irradiation regions 29 is formed of 4×4 pixels 36.

In the scanning operation in Embodiment 1, scanning is performed for each of the mask dies 333. In the example of FIG. 17, an example of scanning a certain mask die 333 is shown. When all the multiple beams 20 are used, $m_1 \times n_1$ sub-irradiation regions 29 are arranged in the x and y directions (two-dimensionally) in one irradiation region 34. The XY stage 105 is moved to a position where the first mask die 333 can be irradiated with the multiple beams 20. The main deflector 208 collectively deflects the whole of the multiple beams 20 to the reference position of the mask die 333 scanned by the multiple beams 20. At this position, the XY stage 105 is stopped and the mask die 333 is scanned (scan operation) using the mask die 333 as the irradiation region 34. When scanning is performed while continuously moving the XY stage 105, the main deflector 208 further performs tracking deflection so as to follow the movement of the XY stage 105. Each beam constituting the multiple beams 20 is in charge of one of the sub-irradiation regions 29 different from each other. Then, one pixel for measurement 28 corresponding to the same position inside the sub-irradiation region 29 in charge is irradiated with each beam during each shot. In the example of FIG. 17, the sub deflector 209 deflects each beam such that the first pixel for measurement 36 positioned rightmost in the lowest tier inside the sub-irradiation region 29 in charge is irradiated in the first shot. Then, irradiation of the first shot is performed. Subsequently, the beam deflection position of the multiple beams 20 as a whole is collectively shifted by the sub deflector 209 by one pixel for measurement 36 in the y direction and the pixel for measurement 36 rightmost in the second lowest tier inside the sub-irradiation region 29 in charge is irradiated with each beam in the second shot. Similarly, the pixel for measurement 36 positioned rightmost in the third lowest tier inside the sub-irradiation region 29 in charge is irradiated with each beam in the third shot. The pixel for measurement 36 positioned rightmost in the fourth lowest tier inside the sub-irradiation region 29 in charge is irradiated with each beam in the fourth shot. Next, the deflection position of the multiple beams 20 as a whole is collectively shifted by the sub deflector 209 to the pixel for measurement 36 positioned second rightmost in the lowest tier and similarly the pixel for measurement 36 is sequentially irradiated with each beam in the y direction. By repeating the above operation, all the pixels for measurement 36 inside one sub-irradiation region 29 are sequentially irradiated with one beam. In one shot, the secondary electrons 300 corresponding to a plurality of shots as many as the number of the holes 22 are maximally detected at a time by the multiple beams formed by passing through each of the holes 22 of the shaping aperture plate array substrate 203.

As described above, while the multiple beams 20 as a whole scan the mask die 333 as the irradiation region 34, each beam scans one corresponding sub-irradiation region 29. When scanning of one mask die 333 is completed, the XY stage 105 is moved such that the next adjacent mask die 333 becomes the irradiation region 34, and the next adjacent mask die 333 is scanned. This operation is repeated to scan each of the chips 332. The secondary electrons 300 are emitted from the pixel for measurement 36 irradiated after each shot of the multiple beams 20 and detected by the detector 222. In Embodiment 1, in the unit detection region size of the detector 222, the secondary electrons 300 emitted upward from each of the pixels for measurement 36 are detected for each of the pixels for measurement 36 (or each of the sub-irradiation regions 29).

By performing scanning using the multiple beams 20 as described above, a scan operation (measurement) can be performed faster than when scanning is performed using a single beam. Incidentally, each of the mask dies 333 may be scanned by the step and repeat operation, or each of the mask dies 333 may be scanned while continuously moving the XY stage 105. If the irradiation region 34 is smaller than the mask die 333, the scan operation may be performed while moving the irradiation region 34 in the mask die 333.

When the substrate 101 is a mask substrate for exposure, a chip region for one chip formed on the mask substrate for exposure is divided into a plurality of stripe regions in a thin rectangular shape of the size of, for example, the mask die 333 described above. Then, for each stripe region, each of the mask dies 333 may be scanned by the scanning similar to the above-described operation. The size of the mask die 333 on the mask substrate for exposure is a size before transfer and thus, the size is four times the size of the mask die 333 of the semiconductor substrate. Therefore, when the irradiation region 34 is smaller than the mask die 333 on the mask substrate for exposure, the scanning operation increases for one chip (for example, four times). However, since a pattern for one chip is formed on the mask substrate for exposure, the number of scans can be smaller than that of a semiconductor substrate on which more than four chips are formed.

As described above, the image acquisition mechanism 150 scans the inspection target substrate 101 on which a figure pattern is formed by using the multiple beams 20 and detects the multiple secondary electrons 300 to be emitted from the substrate 101 to be inspected due to irradiation with the multiple beams 20. Detection data (secondary electron image) of secondary electrons from each of the pixels for measurement 36 detected by the multi-detector 222 is output to the detection circuit 106 in order of measurement. Inside the detection circuit 106, analog detection data is converted into digital data by an A/D converter (not shown) and stored in the pattern memory 123. Then, for example, when the detection data for one chip 332 is accumulated, the detection data is transferred to the comparison circuit 108 together with information indicating each position from the position circuit 107 as chip pattern data.

Figure 18:
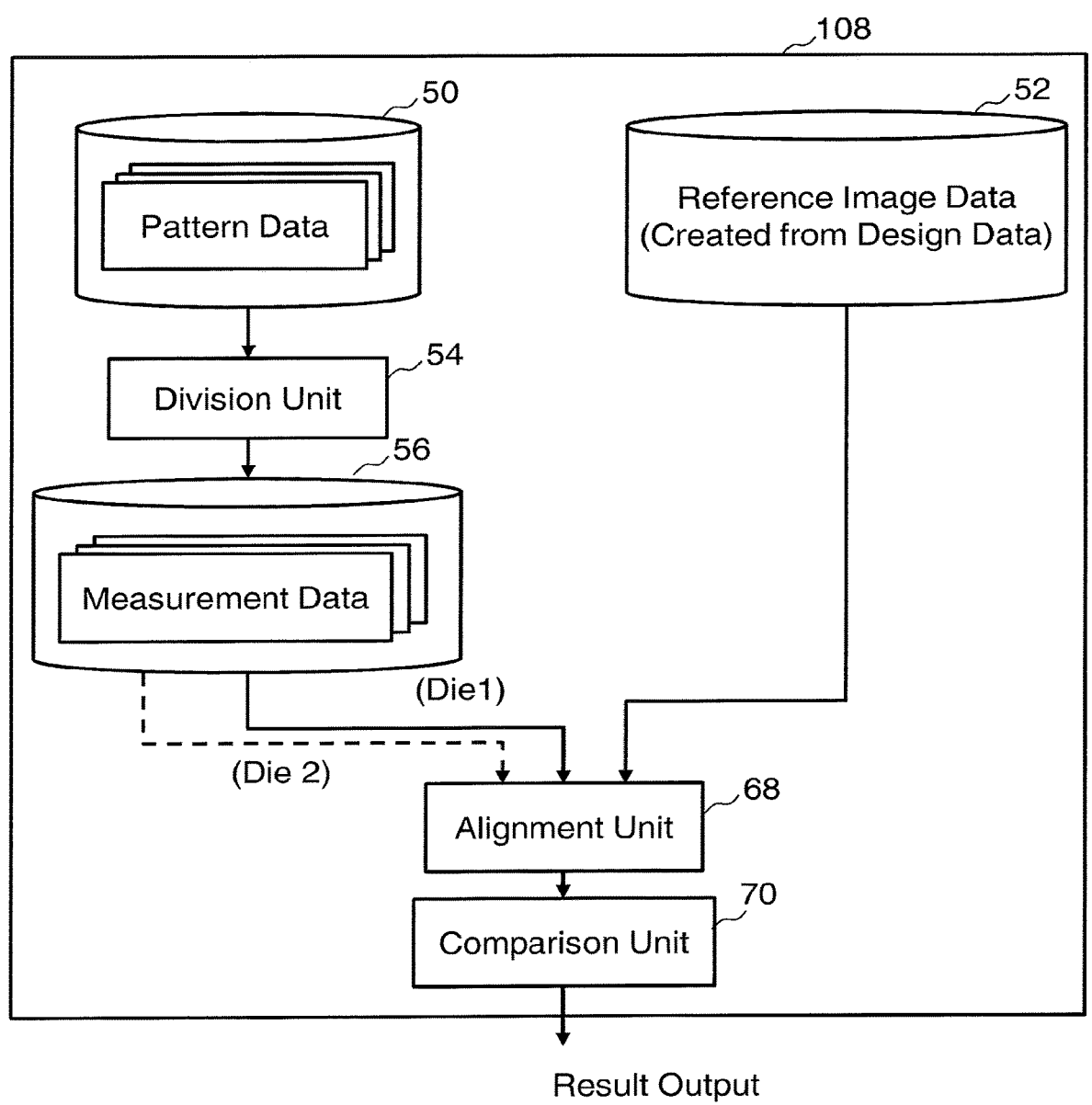
FIG. 18 is an example of an internal block diagram showing the configuration inside a comparison circuit according to Embodiment 1.

FIG. 18 is an example of an internal block diagram showing the configuration inside a comparison circuit according to Embodiment 1. In FIG. 18, storage devices 50, 52, 56 such as a magnetic disk drive, a division unit 54, an alignment unit 68, and a comparison unit 70 are arranged in the comparison circuit 108. Each " . . . unit" such as the division unit 54, the alignment unit 68, and the comparison unit 70 includes a processing circuit and the processing circuit includes an electric circuit, a computer, a processor, a circuit board, a quantum circuit, or a semiconductor device. Further, each " . . . unit" may use a common processing circuit (the same processing circuit). Alternatively, different processing circuits (separate processing circuits) may be used. Input data needed for the division unit 54, the alignment unit 68, and the comparison unit 70 or computed results are stored in a memory (not shown) each time.

FIG. 18 shows a configuration capable of performing both of die-database inspection and die-die inspection. When only the die-die inspection is performed and the die-database inspection is not performed, the storage device 52 in the configuration of FIG. 18 and the reference image creation circuit 112 in FIG. 1 may be unnecessary. First, the die-database inspection will be described. The specific operation of the image acquisition mechanism 150 is as described above. The chip pattern data as an example of a measurement image is transferred to, as described above, the comparison circuit 108. Inside the comparison circuit 108, the chip pattern data is stored in the storage device 50.

As the division process, the division unit 54 divides the chip pattern data into a plurality of mask die images (an example of measurement images) in the size of the mask die 333 serving as the unit inspection region. Each mask die image (an example of the measurement image) is stored in the storage device 56.

As the reference image creation process, the reference image creation circuit 112 creates a reference image for each of the mask dies 333 based on design pattern data on which a pattern formed on the substrate 101 is based or exposure image data of a pattern formed on the substrate 101. A more specific operation is as described below. First, design pattern data (exposure image data) is read out from the storage device 109 through the control computer 110, and each figure pattern defined in the read design pattern data is converted into binary or multivalued image data.

Here, a figure defined in the design pattern data uses, for example, a rectangle and a triangle as basic figures and figure data defining the shape, size, position and the like of each pattern is stored as information, for example, coordinates (x, y) in the reference position of the figure, lengths of sides, figure code to be an identifier to distinguish the figure type such as the rectangle and the triangle.

When design pattern data to be such figure data is input into the reference image creation circuit 112, the reference image creation circuit 112 expands the design pattern data up to data for each figure and interprets the figure code indicating the figure shape of the figure data, figure dimensions and the like. Then, the reference image creation circuit 112 expands the figure data into binary or multivalued design pattern image data as a pattern arranged inside a square using the grid of a predetermined quantization dimension as the unit and outputs the design pattern image data. In other words, the reference image creation circuit 112 reads design data, calculates an occupancy rate occupied by figures in a design pattern for each square created by virtually dividing an inspection region into squares in units of a predetermined dimension, and outputs n-bit occupancy rate data. For example, one square is suitably set as one pixel. Then, if one pixel should have a resolution of $1/2^8$ (=1/256), the occupancy rate in the pixel is calculated by allocating small regions of 1/256 to the regions of figures arranged in the pixel. Then, 8-bit occupancy rate data is output to the reference circuit 112. Such a square (inspection pixel) may be matched with the pixels of the measurement data.

Next, the reference image creation circuit 112 performs appropriate filter processing on the design image data of design patterns as image data of figures. Optical image data as a measurement image is in a state in which filtering acts thereon by an optical system, in other words, an analog state changing continuously and thus, the design image data as image data on the design side in which the image intensity (gray level) is a digital value can be adjusted to the measurement data by performing the filter processing also thereon.

When the exposure image data is stored as gradation data for each pixel, the exposure image data of the target mask die may be used as a reference image. If the exposure image data is graphic data that defines the shape, size, position, etc. of each pattern figure with information such as coordinates (x, y), side length, figure code and the like, a reference image may be created by the same method as that used to create the above-described design pattern data. The image data of the created reference image is output to the comparison circuit 108. In the comparison circuit 108, the image data of the reference image is stored in the storage device 52.

As the alignment process, the alignment unit 68 aligns the image of the mask die 333 (mask die image) to be a measurement image and the reference image corresponding to the measurement image. For the alignment, for example, the least square method is suitably used.

As the comparison process, the comparison unit 70 compares the measurement image and the reference image pixel by pixel. By using a predetermined determination threshold value, both are compared pixel by pixel according to a predetermined determination condition, for example, the presence or absence of a defect such as a shape defect. If, for example, the gradation value difference for each pixel is larger than a determination threshold Th, the comparison unit 70 determines that there is a defect. Then, a comparison result is output. The comparison result may be output to the storage device 109, the monitor 117, or the memory 118. Alternatively, the comparison result may be output from the printer 119.

Alternatively, a contour line of a figure pattern from each of the measurement image and the reference image may be generated to compare deviations between the contour lines of the matching figure pattern. For example, if the deviation between the contour lines is larger than a determination threshold value Th', the deviation is determined as a defect. Then, a comparison result is output. The comparison result may be output to the storage device 109, the monitor 117, or the memory 118. Alternatively, the comparison result may be output from the printer 119.

Next, a case where the die-die inspection is performed will be described. In such a case, for the image comparison, for example, images of the mask dies 333 are compared.

As the alignment process, the alignment unit 68 reads an image of the mask die 333 (mask die image) (die 1) to be an inspected image and an image of the mask die 333 (mask die image) (die 2) to be a reference image corresponding to the inspected image from the storage device 56 to align both images. For the alignment, for example, the least square method is suitably used.

Contents of the comparison process may be the same as those described above. Then, a comparison result is output. The comparison result may be output to the storage device 109, the monitor 117, or the memory 118. Alternatively, the comparison result may be output from the printer 119.

According to Embodiment 1, as described above, the primary optical system and the secondary optical system can be adjusted in an image acquisition apparatus using the multiple beams 20. Thus, a highly accurate image can be acquired. As a result, highly accurate pattern inspection can be performed.

Embodiment 2

In Embodiment 1, a configuration in which the movable wide-area detector 230 is disposed on an optical path upstream of the multi-detector 222 was described. However, the adjustment method of the optical system is not limited to the above example. In Embodiment 2, a configuration in which secondary electrons are guided to a wide-area detector disposed outside the optical path to detect the secondary electrons will be described.

Figure 19:
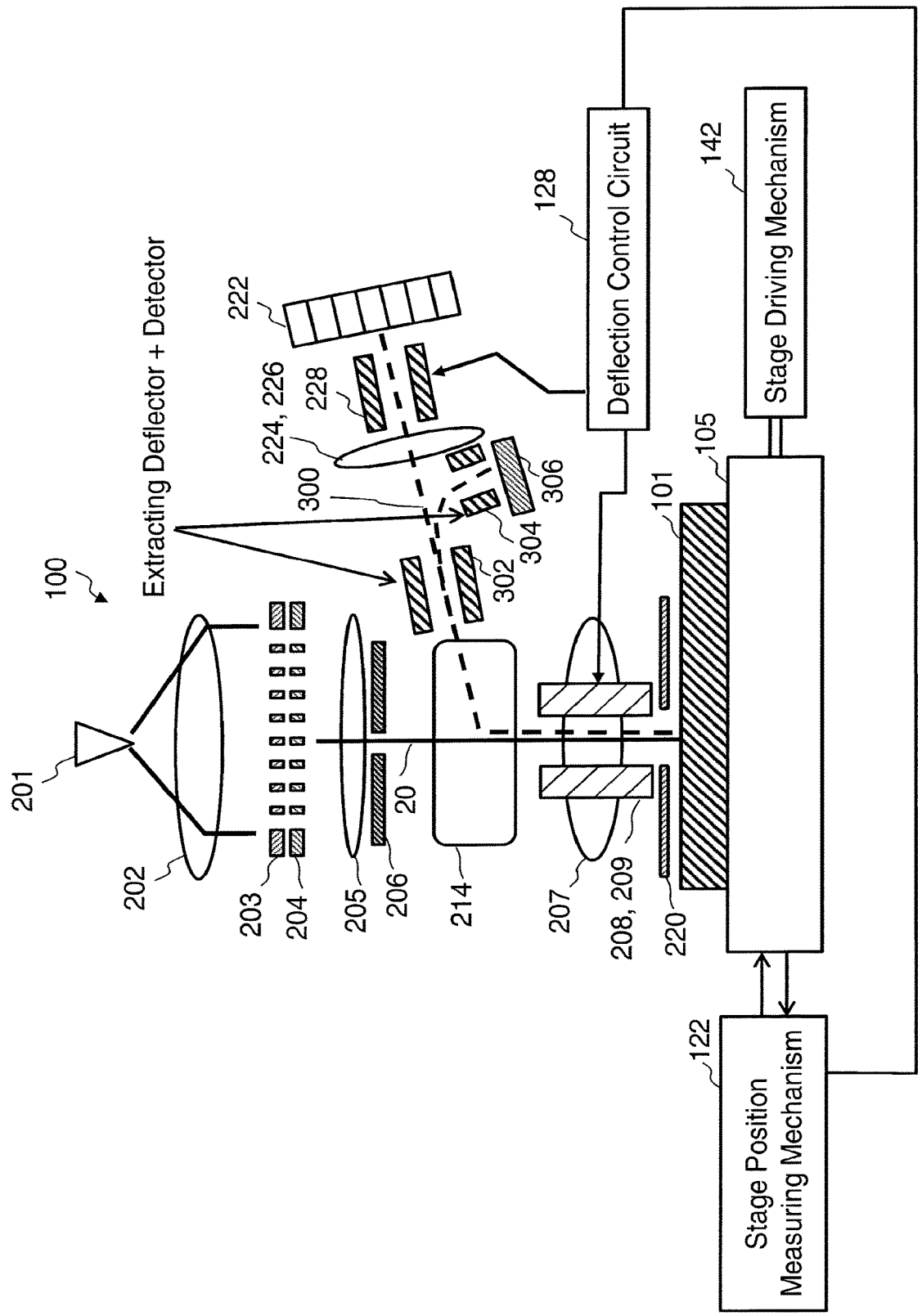
FIG. 19 is a block diagram showing a portion of the configuration of a pattern inspection apparatus according to Embodiment 2.

FIG. 19 is a block diagram showing a portion of the configuration of a pattern inspection apparatus according to Embodiment 2. In FIG. 19, in order to simplify the description, the illustration of portions other than a portion necessary for description is omitted. In addition, a portion of the optical system of the primary electron optics is not shown. In the example of FIG. 19, the inspection apparatus 100 includes a wide-area detector 306 and deflectors 302, 304 instead of the movable wide-area detector 230, the loading/unloading control circuit 130, and the driving mechanism 132 in FIG. 1. The wide-area detector 306 and the deflectors 302, 304 are arranged inside the electron beam column 102. Other portions of the configuration are the same as in FIG. 1. Each of the deflectors 302, 304 includes, for example, an electrode pair of two poles.

The optical system adjustment method of an inspection apparatus according to Embodiment 2 performed, among a series of processes shown in FIG. 3, a series of processes including the primary electron beam extraction process (S104), the primary electron beam position coarse adjustment process (S106), the secondary electron trajectory coarse adjustment process (S110), the primary electron beam adjustment process (S112), the primary electron beam extraction process (S116), the secondary electron trajectory adjustment process (S118), and the determination process (S120).

The contents not specifically described below are the same as those in Embodiment 1.

The contents of the primary electron beam extraction process (S104) and the primary electron beam position coarse adjustment process (S106) are the same as those in Embodiment 1.

Here, the deflector 302 is disposed on an optical path for guiding the multiple secondary electrons 300 to the multi-detector 222 (first detector) capable of individually detecting the multiple secondary electrons 300. More specifically, the deflector 302 is disposed on an optical path between the beam separator 214 and the projection lens 224. The deflector 304 is disposed between the beam separator 214 and the projection lens 224 at a position outside the optical path capable of deflecting the trajectory of the multiple secondary electrons 300 by the deflector 302. Then, the wide-area detector 306 is disposed at a position outside the optical path capable of deflecting the trajectory of the multiple secondary electrons 300 by the deflector 304. Incidentally, the deflector 304 may be omitted if the multiple secondary electrons 300 can be arranged so as to be able to reach the wide-area detector 306 at a position outside the optical path by deflection using the deflector 302. Also, the wide-area detector 306 is suitably disposed at a position outside the optical path between the beam separator 214 and the projection lens 224. However, the present embodiment is not limited to such an example. The wide-area detector 306 may be disposed closer to the multi-detector 222 than the projection lens 224 as long as the wide-area detector 306 is closer to the beam separator 214 than the multi-detector 222. The wide-area detector 306 (second detector) has a detection surface of a size capable of detecting the multiple secondary electrons 300 as a whole. In addition, the wide-area detector 306, which may be movable, is used without being moved in Embodiment 2.

As described above, even if design parameters are set to each of the primary electron optics and the secondary electron optics as the initial values, the position on the substrate 101 irradiated with each of the multiple beams 20 may deviate from the desired position. Then, it is necessary to first cause the secondary electrons to reach the multi-detector 222. However, if the angle of the traveling direction of secondary electrons bent by the beam separator 214 deviates from a desired angle, secondary electrons may not reach the multi-detector 222. Thus, in Embodiment 2, like in Embodiment 1, the wide-area detector 306 is arranged at a position where the distance from the beam separator 214 is nearer (shorter) than the distance from the multi-detector 222. Accordingly, the influence of deviation of the angle of the traveling direction of secondary electrons bent by the beam separator 214 on the positional deviation is significantly reduced so that the secondary electrons can be made more easily detectable. However, in Embodiment 1, since the wide-area detector 230 blocks the optical path of the secondary electron optics, it is necessary to move the wide-area detector 230 from the optical path when the secondary electron optics is adjusted or during normal pattern inspection. Thus, it is necessary to configure the wide-area detector 230 as a movable type. Therefore, in Embodiment 2, the trajectory of secondary electrons can be deflected via the deflectors 302, 304 so that the wide-area detector 306 can be disposed outside the optical path from the beginning.

As the secondary electron trajectory coarse adjustment process (S110), the trajectory of the secondary electrons 301 is coarsely adjusted such that the secondary electrons 301 emitted due to irradiation of one beam extracted from the multiple beams 20 pass through the deflection region of the deflector 302. More specifically, setting values of the beam separator 214 are adjusted. The fact that by adjusting the intensity of the electric field and the magnetic field generated by the beam separator 214, the direction to which a beam is bent can be adjusted is as described above. Since the primary electron beam position coarse adjustment process (S106) using the transmission mark 219 has already been completed, the secondary electrons 301 whose trajectory is bent by the beam separator 214 frequently pass through the deflection region of the deflector 302 by matching the settings of the beam separator 214 to the design values. In particular, when the central beam of the multiple beams 20 is used as the target beam, the secondary electrons 301 normally pass through the deflection region of the deflector 302.

The deflection control circuit 128 controls the deflection voltage applied to the deflector 302 such that the secondary electrons 301 passing through the deflection region of the deflector 302 pass through the deflection region of the deflector 304. Similarly, the deflection control circuit 128 controls the deflection voltage applied to the deflector 304 such that the secondary electrons 301 passing through the deflection region of the deflector 304 collide with the wide-area detector 306. The detection surface of the wide-area detector 306 can detect a wide area like in Embodiment 1 and also the distance between the deflector 302 and the deflector 304 and the distance between the deflector 304 and the wide-area detector 306 can be configured to be short and thus, even if the deflection voltage applied to the deflectors 302, 304 deviates from the design value, the deviation amount thereof can be made small.

However, when a beam cannot be detected by the wide-area detector 306, the setting values of the beam separator 214 are adjusted to cause the secondary electrons 301 emitted due to irradiation with a target beam to hit the detection surface of the wide-area detector 306 via the deflectors 302, 304. If it is difficult to cause the secondary electrons 301 to hit the detection surface of the wide-area detector 306 only by adjusting the beam separator 214, the trajectory of the secondary electrons 301 is caused to hit the detection surface of the wide-area detector 306 by adjusting the deflection voltage applied to the deflectors 302, 304. If it is difficult to cause the secondary electrons 301 to hit the detection surface of the wide-area detector 306 even after the above adjustment, the alignment coil 232 may be used to cause the trajectory of the secondary electrons 301 to hit the detection surface of the wide-area detector 306. Whether or not the secondary electrons 301 hit the detection surface of the wide-area detector 306 can be determined by whether or not the secondary electrons 301 have been detected by the wide-area detector 306.

Since the detection surface of the wide-area detector 306 has a wide-area size as described above, it is easy to detect the secondary electrons 301 but, on the other hand, the position of the detection surface where the secondary electrons 301 are detected cannot be determined. Therefore, even if the deflection by the deflectors 302, 304 is stopped while the trajectory of the secondary electrons 301 remains unchanged, the desired position of the multi-detector 222 may not necessarily be reached. However, an image of the secondary electrons 301 can be acquired by being able to detect the secondary electrons 301 of the target beam by the wide-area detector 306. Therefore, the adjustment of the next primary electron beam is enabled. Incidentally, like in Embodiment 1, a region division type detector may also suitably be used as the wide-area detector 306.

As the primary electron beam adjustment process (S112), while detecting the secondary electrons 301 corresponding to each beam (primary electron beam) extracted one by one by the wide-area detector 306 (second detector) having a detection surface of a size capable of detecting the whole of the multiple secondary electrons 300, the trajectory of the target beam is adjusted using the primary electron optics by performing trajectory deflection of the secondary electrons 301 by the deflector 302 (and, if necessary, the deflector 304) disposed on an optical path for guiding the multiple secondary electrons 300 to the multi-detector 222. The method of adjustment is the same as in Embodiment 1.

Then, the primary electron optics is adjusted such that when each process from the primary electron beam extraction process (S104) to the primary electron beam adjustment process (S112) is performed for the central beam and the four corner beams of the multiple beams 20, comparable secondary electron images are each obtained under the same lens conditions for the whole of the multiple beams 20. By making such adjustments, the irradiation position and the focal point of the multiple beams 20 are aligned (the adjustment of the primary electron optics is completed). Further, with such adjustments, each secondary electron outside the multiple secondary electrons 300 is detected and thus, the multiple secondary electrons 300 as a whole can already be detected by the wide-area detector 306.

When the adjustments of the primary electron optics are completed as described above, adjustments of the secondary electron optics are next made. In Embodiment 2, there is nothing that shields the optical path of the secondary electron optics if beam deflection by the deflector 302 is stopped. Therefore, the wide-area detector unloading process (S114) in Embodiment 1 can be made unnecessary. Hereinafter, the contents of each process of the primary electron beam extraction process (S116), the secondary electron trajectory adjustment process (S118), and the determination process (S120) are the same as those in Embodiment 1. It is needless to say that in the secondary electron trajectory adjustment process (S118), since the wide-area detector 306 is originally disposed outside the optical path, the wide-area detector 306 is substantially the same state as the state of the wide-area detector 230 in Embodiment 1 moved from the optical path to the outside of the optical path.

According to Embodiment 2, as described above, the multiple secondary electrons 300 travel into the control range of the secondary electron optics by adjusting the first electron optics and thus, the secondary electron optics can easily be adjusted. In fact, the adjustment can be made with little effort. Furthermore, in Embodiment 2, after the primary electron optics is adjusted, like in Embodiment 1, the secondary electron optics can be adjusted without opening the inside of the electron beam column 102 to the atmosphere. Further, the loading/unloading operation of the wide-area detector 306 can be made unnecessary. Therefore, it is possible to avoid the risk of particles being generated while moving the wide-area detector 306.

By adjusting the optical systems of the inspection apparatus 100 as described above, a secondary electron image (SEM image) can be acquired. Then, like in Embodiment 1, the substrate 101 as an inspection target can be inspected using the acquired secondary electron image.

Embodiment 3

In each of Embodiments described above, a configuration in which the multiple beams 20 are formed from one electron beam 200 using the shaping aperture plate array substrate 203 has been described, but the present embodiment is not limited to such an example.

Figure 20:
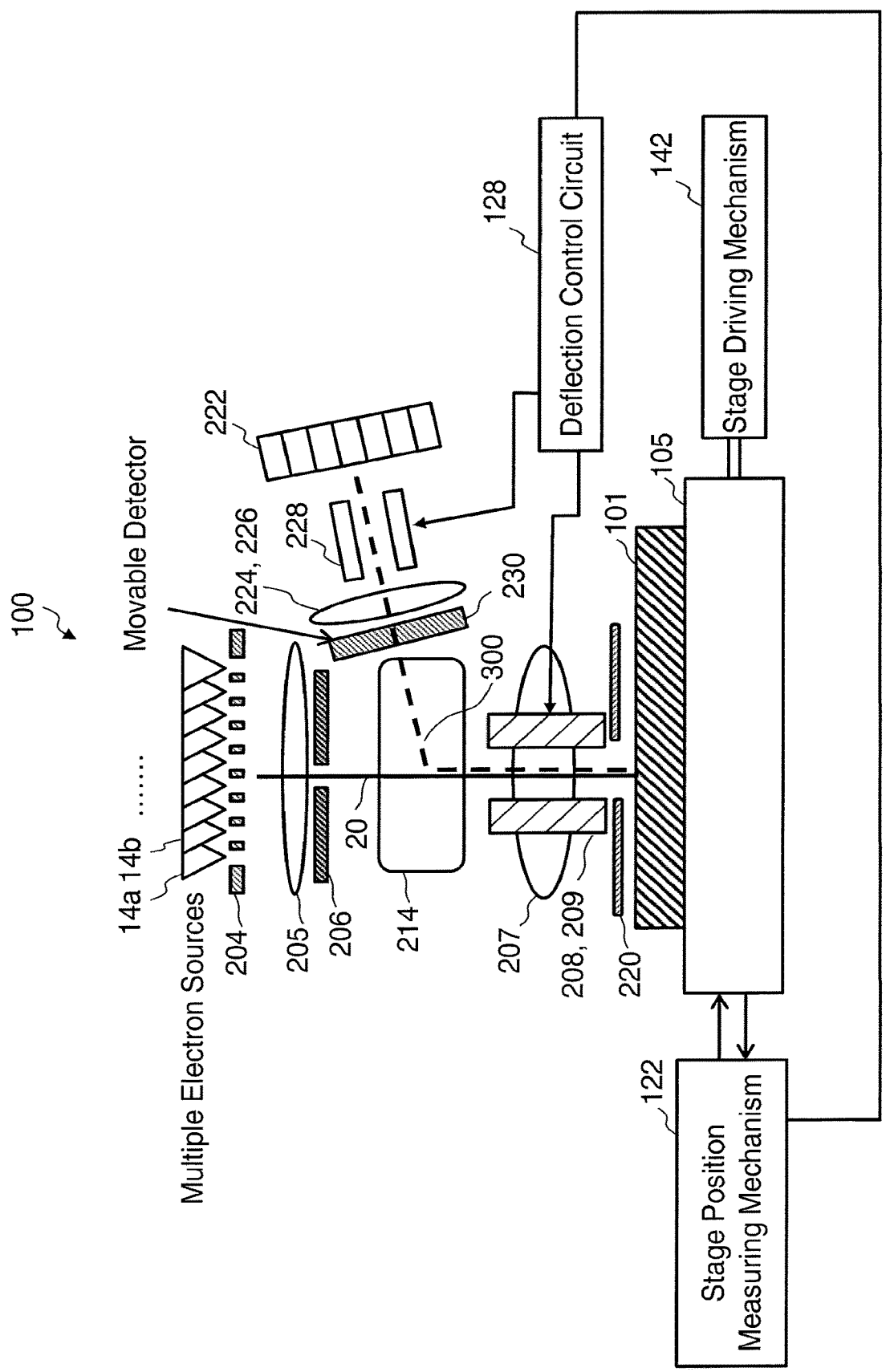
FIG. 20 is a block diagram showing a portion of the configuration of a pattern inspection apparatus according to Embodiment 3.

FIG. 20 is a block diagram showing a portion of the configuration of a pattern inspection apparatus according to Embodiment 3. In FIG. 20, in order to simplify the description, the illustration of portions other than a portion necessary for description is omitted. In addition, a portion of the optical system of the primary electron optics is not shown. In the example of FIG. 20, multiple electron gun assemblies 14a, 14b, . . . are arranged instead of the electron gun assembly 201, the illumination lens 202 and the shaping aperture plate array substrate 203 in FIG. 1. Other portions of the configuration are the same as in FIG. 1. As shown in FIG. 20, even a configuration in which the multiple beams 20 are directly emitted from the multiple electron gun assemblies 14a, 14b, . . . can achieve the same effect as in Embodiment 1. In the example of FIG. 20, the positions of a plurality of passing holes of the blanking aperture array mechanism 204 are formed by fitting to the passage positions of the multiple beams 20 emitted from the multiple electron gun assemblies 14a, 14b, . . . . Alternatively, a plurality of tiers of electromagnetic lenses (not shown) may be disposed between the multiple electron gun assemblies 14a, 14b, . . . and the blanking aperture array mechanism 204 so that the passage positions of the multiple beams 20 are suitably aligned with the positions of the plurality of passing holes of the blanking aperture array mechanism 204 by adjusting the magnification of an image of the multiple beams 20 emitted from the multiple electron gun assemblies 14a, 14b, . . . .

Only a necessary electron beam can be generated by using the multiple electron gun assemblies capable of individually controlling the generation of electron beams by providing an On/Off gate electrode of electron beams in each electron gun assembly constituting the array structure of the multiple electron gun assemblies and individually controlling the voltage applied to the gate electrode.

Figure 21:
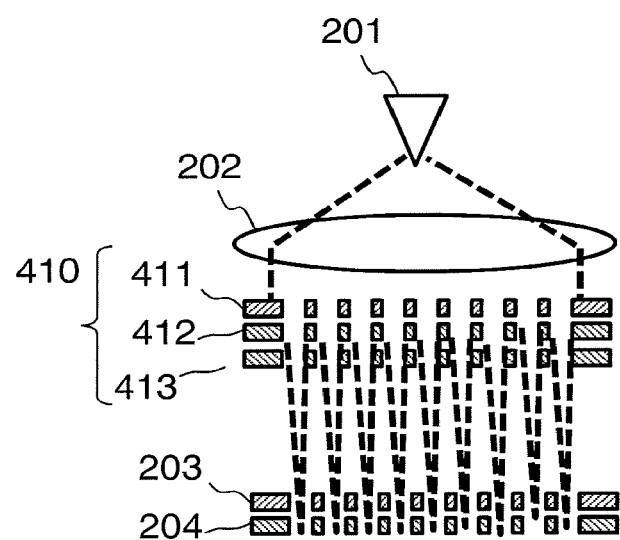
FIG. 21 is a block diagram showing a modification of a portion of the configuration of the pattern inspection apparatus according to Embodiment 3.

FIG. 21 is a block diagram showing a modification of a portion of the configuration of the pattern inspection apparatus according to Embodiment 3. As a method of obtaining a plurality of electron sources, as shown in FIG. 21, a lens array 410 is provided downstream of the illumination lens 202 to form a plurality of crossover images so that the obtained crossover images can be used as multiple electron sources by projecting onto a target object surface in a reduced form. As a lens array, for example, three conductor electrodes 411, 412, 413 having openings arranged in an array are arranged along the optical axis, and a voltage is applied to the electrode 412 in the center to use the lens array as an einzel lens array. In this case, if a crossover image is formed in the center of deflection of the blanking aperture array mechanism 204, fluctuations of the position of the primary electron beam during the operation of the blanking deflector can suitably be suppressed.

The optical system adjustment method of the inspection apparatus in Embodiment 3 is the same as in FIG. 3. Then, the contents not particularly described in Embodiment 3 are the same as those in Embodiment 1.

According to Embodiment 3, as described above, the multiple secondary electrons 300 travel into the control range of the secondary electron optics by adjusting the first electron optics and thus, the secondary electron optics can easily be adjusted. Further, after the primary electron optics is adjusted, like in each of Embodiments described above, the secondary electron optics can be adjusted without opening the inside of the electron beam column 102 to the atmosphere.

By adjusting the optical systems of the inspection apparatus 100 as described above, a secondary electron image (SEM image) can be acquired. Then, like in Embodiment 1, the substrate 101 as an inspection target can be inspected using the acquired secondary electron image.

Embodiment 4

In each of Embodiments described above, a case where the optical axis of the multiple beams 20 as a whole formed by the shaping aperture plate array substrate 203 is linearly formed up to the substrate 101 has been described, but the present embodiment is not limited to such a case.

Figure 22:
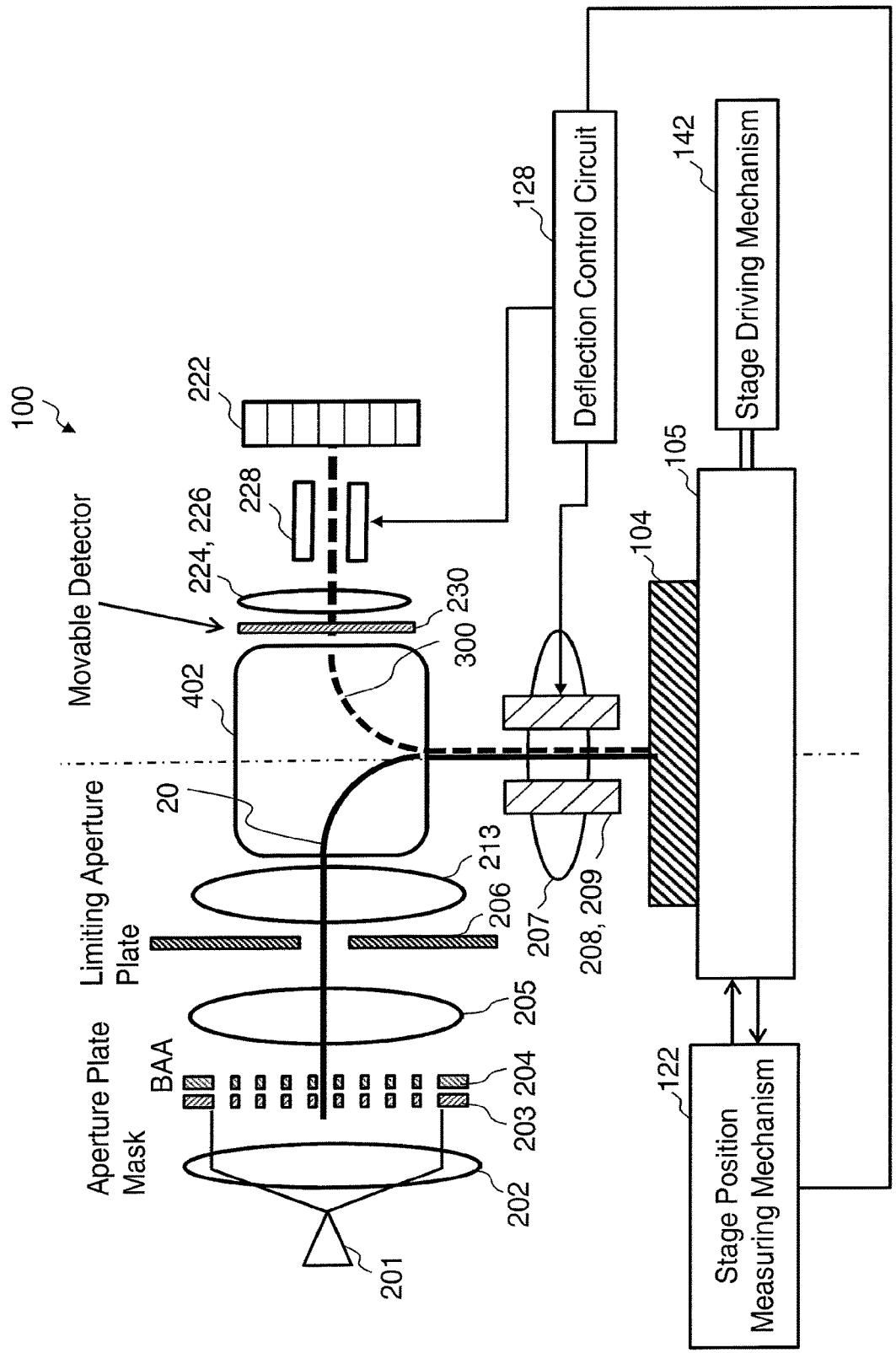
FIG. 22 is a block diagram showing the configuration of a pattern inspection apparatus according to Embodiment 4.

FIG. 22 is a block diagram showing the configuration of a pattern inspection apparatus according to Embodiment 4. In FIG. 22, the inspection apparatus 100 for inspecting a pattern formed on the substrate 101 is configured as follows.

The electron beam 200 emitted in the width direction from the electron gun assembly 201 (emission source) illuminates the entire shaping aperture plate array substrate 203 almost vertically through the illumination lens 202. The shaping aperture plate array substrate 203 has a plurality of rectangular holes 22 (openings) formed therein and the electron beam 200 illuminates a region including all the plurality of holes 22. A plurality of electron beams (multiple beams) 20 in, for example, a rectangular shape is formed by each portion of the electron beams 200 with which the positions of the plurality of holes 22 are irradiated being passed through each of the plurality of holes 22 of the shaping aperture plate array substrate 203.

The formed multiple beams 20 (primary electron beams) pass through the blanking aperture array mechanism 204 and are reduced by the reduction lens 205 before traveling toward a hole in the center formed in the limiting aperture plate substrate 206.

The multiple beams 20 having passed through the limiting aperture plate substrate 206 are refracted by the reduction lens 213 toward the optical axis to form a crossover (C.O.). Then, after passing through the beam separator 402 disposed at a crossover position of the multiple beams 20, the multiple beams 20 are bent by 90° before traveling to the objective lens 207 below. The multiple beams 20 having passed through the beam separator 402 are focused on the surface of the substrate 101 by the objective lens 207 to form an image of the multiple beams (electron beam) on the substrate 101. At this point, the multiple beams 20 as a whole having passed through the limiting aperture plate substrate 206 are collectively deflected in the same direction by the main deflector 208 and the sub deflector 209 and the irradiation position of each beam on the substrate 101 is irradiated therewith. In such a case, the multiple beams 20 as a whole are collectively deflected by the main deflector 208 and the sub deflector 209 to the reference position of the mask die scanned by the multiple beams 20. Then, a flux of secondary electrons (multiple secondary electrons 300) corresponding to each beam of the multiple beams 20 and including reflected electrons is emitted from the substrate 101 due to irradiation to a desired position on the substrate 101 with the multiple beams 20.

The multiple secondary electrons 300 emitted from the substrate 101 are refracted to the center side of the multiple secondary electrons 300 by the objective lens 207 before traveling to the beam separator 402.

Here, for example, an electromagnetic prism is used as the beam separator 402. The beam separator 402 separates the incident beam and emission beam trajectories by deflecting the trajectories by 90° in opposite directions. In the example of FIG. 21, the multiple beams (primary electron beams) entering the beam separator 402 from the left side are deflected downward by 90° and output. Accordingly, the multiple beams 20 travel straight downward. On the other hand, the multiple secondary electrons 300 entering the beam separator 402 from below are deflected to the right by 90° and output. Accordingly, the multiple secondary electrons 300 travel straight to the right.

The multiple secondary electrons 300 bent to the right are projected onto the multi-detector 222 while being refracted by the projection lenses 224, 226 in a state where the wide-area detector 230 is not loaded onto the optical path. The multi-detector 222 detects the projected multiple secondary electrons 300. The multi-detector 222 has, for example, a diode type two-dimensional sensor (not shown). Then, in the diode-type two-dimensional sensor position corresponding to each beam of the multiple beams 20, each secondary electron of the multiple secondary electrons 300 collides with a diode-type two-dimensional sensor to generate electrons, and secondary electrons image data for each pixel described later. When the XY stage 105 performs a scanning operation while moving, the deflector 228 deflects the multiple secondary electrons 300 (tracking control) so as to follow the movement of the XY stage 105 so that the detection position of each secondary electron of the multiple secondary electrons 300 in the multi-detector 222 do not deviate with the movement of the XY stage 105.

As described above, the inspection apparatus 100 has a primary electron optics that adjusts the trajectory (the irradiation position, focal point and so on) of the multiple beams 20 (primary electron beams) and a secondary electron optics that adjusts the trajectory (the irradiation position, focal point and so on) of the multiple secondary electrons 300 (secondary electrons) arranged therein. However, in the state where the adjustments (beam adjustments) of the primary electron optics and the secondary electron optics are not completed, the above-described trajectory of electrons is not normally obtained. Therefore, adjustments of the primary electron optics and the secondary electron optics are needed.

The optical system adjustment method of the inspection apparatus in Embodiment 4 is the same as in FIG. 3. Then, the contents not particularly described in Embodiment 4 are the same as those in Embodiment 1.

Also in the example of FIG. 22, under the control of the loading/unloading control circuit 130, the driving mechanism 132 loads and arranges the movable wide-area detector 230 on an optical path to guide the multiple secondary electrons 300 emitted due to irradiation to a target with the multiple beams 20 to the multi-detector 222 (first detector) capable of individually detecting the multiple secondary electrons 300. More specifically, the wide-area detector 230 is disposed on an optical path between the beam separator 402 and the projection lens 224. Then, the adjustment of the primary electron optics is performed for each beam and then, the wide-area detector 230 is unloaded. Then, the adjustment of the secondary electron optics is performed for each beam.

As described above, also in the case of using the beam separator 402 formed of an electromagnetic prism, the adjustment of the electron optics using the movable wide-area detector 230 is effective.

According to Embodiment 4, as described above, the multiple secondary electrons 300 travel into the control range of the secondary electron optics by adjusting the first electron optics and thus, the secondary electron optics can easily be adjusted. Further, after the primary electron optics is adjusted, like in each of Embodiments described above, the secondary electron optics can be adjusted without opening the inside of the electron beam column 102 to the atmosphere.

By adjusting the optical systems of the inspection apparatus 100 as described above, a secondary electron image (SEM image) can be acquired. Then, like in Embodiment 1, the substrate 101 as an inspection target can be inspected using the acquired secondary electron image.

In the above description, a series of "... circuits" includes a processing circuit, and the processing circuit includes an electric circuit, a computer, a processor, a circuit board, a quantum circuit, a semiconductor device, or the like. Also, each "... circuit" may use a common processing circuit (the same processing circuit). Alternatively, different processing circuits (separate processing circuits) may be used. A program causing a processor or the like to execute may be recorded in a record carrier body such as a magnetic disk drive, a magnetic tape device, FD, ROM (read-only memory) or the like. For example, the position circuit 107, the comparison circuit 108, the reference image creation circuit 112, and the like may be constructed of at least one processing circuit described above.

In the foregoing, Embodiments have been described with reference to concrete examples. However, the present disclosure is not limited to these concrete examples. For example, in Embodiments 3, 4 described above, like in Embodiment 2, a configuration in which the deflectors 302, 304 and the wide-area detector 306 are arranged instead of the movable wide-area detector 230 can be applied.

Also, by further arranging an aberration corrector like a mirror corrector on the detector side from the separator of the secondary electron trajectory to reduce chromatic aberration and spherical aberration in the secondary electron optical system, the spread of individual beams of the multiple secondary electrons 300 by the two-dimensional sensor of the multi-detector 222 can be suppressed.

Portions of the apparatus configuration, the control method, and the like that are not needed directly for the description of the present disclosure are not described. However, a necessary apparatus configuration and a necessary control method can be appropriately selected and used.

In addition, all optical system adjustment methods of image apparatuses, pattern inspection methods, and pattern inspection apparatuses which include the elements of the present disclosure and can be attained by appropriately changing in design by a person skilled in the art are included in the spirit and scope of the present disclosure.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An optical system adjustment method of an image acquisition apparatus comprising:

deflecting one primary electron beam one after another from multiple primary electron beams such that remaining primary electron beams excluding a desired primary electron beam of the multiple primary electron beams become beam OFF using a blanking aperture array mechanism including a substrate including a plurality of passing holes formed by fitting to positions where the multiple primary electron beams pass and a plurality of electrode pairs each arranged in a set of positions facing each other across a corresponding passing hole of the plurality of passing holes;

adjusting a trajectory of the desired primary electron beam by primary electron optics and detecting secondary electrons corresponding to the desired primary electron beam for each of the primary electron beams deflected one after another using a movable second detector having an inspection surface of a size capable of detecting the multiple secondary electrons as a whole and arranged on an optical path for guiding the multiple secondary electrons to a first detector being capable of individually detecting multiple secondary electron beams emitted due to irradiation of a target with the multiple primary electron beams; and after adjustments of the trajectory of each of the primary electron beams deflected one after another being completed, adjusting the trajectory of the secondary electrons by secondary electron optics such that the secondary electrons corresponding to the desired primary electron beam are detected in a corresponding region of the first detector for each of the primary electron beams deflected one after another in a state that the second detector has been moved from the optical path to an outside of the optical path.

2. The method according to claim 1, wherein, a region division type detector is used as the second detector.

3. The method according to claim 1, further comprising: making coarse adjustments of an irradiation position of the desired primary electron beam before the trajectory of the desired primary electron beam is adjusted.

4. The method according to claim 3, wherein the coarse adjustments of the irradiation position of the desired primary electron beam are made using a transmission mark on which a through hole whose diameter is smaller than an inter-beam pitch of the multiple primary electron beams is formed therein.

5. An optical system adjustment method of an image acquisition apparatus comprising:

making one primary electron beam pass through one after another from multiple primary electron beams such that remaining primary electron beams excluding a desired primary electron beam of the multiple primary electron beams become beam OFF using a movable shutter including an opening that allows the desired primary electron beam of the multiple primary electron beams to pass through while shielding remaining primary electron beams, adjusting a trajectory of the desired primary electron beam by a primary electron optics and detecting secondary electrons corresponding to the desired primary electron beam for each of the primary electron beams passed through one after another using a movable second detector having an inspection surface of a size capable of detecting the multiple secondary electrons as a whole and arranged on an optical path for guiding the multiple secondary electrons to a first detector being capable of individually detecting multiple secondary electron beams emitted due to irradiation of a target with the multiple primary electron beams; and after adjustments of the trajectory of each of the primary electron beams passed through one after another being completed, adjusting the trajectory of the secondary electrons by secondary electronic optics such that the secondary electrons corresponding to the desired primary electron beam are detected in a corresponding region of the first detector for each of the primary electron beams passed through one after another in a state that the second detector has been moved from the optical path to an outside of the optical path.

6. The method according to claim 5, wherein a region division type detector is used as the second detector.

7. The method according to claim 5, further comprising: making coarse adjustments of an irradiation position of the desired primary electron beam before the trajectory of the desired primary electron beam is adjusted.

8. The method according to claim 7, wherein the coarse adjustments of the irradiation position of the desired primary electron beam are made using a transmission mark on which a through hole whose diameter is smaller than an inter-beam pitch of the multiple primary electron beams is formed therein.

* * * * *